United States Patent
Harayama et al.

(10) Patent No.: US 8,129,259 B2
(45) Date of Patent: Mar. 6, 2012

(54) MANUFACTURING METHOD OF PREPARING A SUBSTRATE WITH FORMING AND REMOVING THE CHECK PATTERNS IN SCRIBING REGIONS BEFORE DICING TO FORM SEMICONDUCTOR DEVICE

(75) Inventors: Yoichi Harayama, Nagano (JP);
Takaharu Yamano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 149 days.

(21) Appl. No.: 12/819,379

(22) Filed: Jun. 21, 2010

(65) Prior Publication Data

US 2011/0003433 A1    Jan. 6, 2011

(30) Foreign Application Priority Data

Jul. 1, 2009    (JP) ................................. 2009-156803

(51) Int. Cl.
*H01L 21/00*    (2006.01)
(52) U.S. Cl. .......... 438/462; 438/33; 438/113; 438/114; 438/460; 438/465; 438/689; 438/690; 257/E21.599
(58) Field of Classification Search .................... 438/33, 438/113, 114, 460, 462, 465, 689, 690, FOR. 386; 257/E21.599
See application file for complete search history.

(56) References Cited

U.S. PATENT DOCUMENTS

| 6,473,966 | B1 * | 11/2002 | Kohno et al. ................. 29/890.1 |
| 2004/0058535 | A1 * | 3/2004 | Matsutani et al. ............ 438/689 |
| 2004/0147097 | A1 * | 7/2004 | Pozder et al. ................. 438/584 |
| 2005/0085009 | A1 * | 4/2005 | Yamaguchi et al. .......... 438/106 |
| 2005/0164127 | A1 * | 7/2005 | Reid et al. ...................... 430/311 |
| 2007/0190691 | A1 * | 8/2007 | Humpston et al. ............ 438/113 |
| 2007/0200585 | A1 * | 8/2007 | Takeuchi et al. .............. 324/763 |
| 2009/0227088 | A1 * | 9/2009 | Kida et al. ..................... 438/462 |
| 2009/0272973 | A1 * | 11/2009 | Yoshida et al. ................. 257/48 |

FOREIGN PATENT DOCUMENTS

JP    2001-168231    6/2001

* cited by examiner

*Primary Examiner* — Thanh V Pham
(74) *Attorney, Agent, or Firm* — IPUSA, PLLC

(57) ABSTRACT

A disclosed device includes a manufacturing method of semiconductor device including preparing a semiconductor substrate including semiconductor chip forming regions, scribing regions surrounding these regions, and cutting regions formed in the scribing regions and narrower than the scribing regions, forming check patterns and semiconductor chips, forming a resist film, forming through grooves narrower than the scribing regions and wider than the check patterns and the cutting regions, removing the check patterns with a wet blast process using the resist film and collectively forming grooves at portions of a protection film and the semiconductor substrate facing the through grooves, removing the resist film, forming internal connection terminals on the contacting faces, forming an insulating resin layer, forming a wiring forming face by removing until connecting faces are exposed, forming wiring patterns, and cutting the semiconductor substrate, the insulating resin layer, and a solder resist layer to separate into individual semiconductor devices.

5 Claims, 21 Drawing Sheets

MANUFACTURING METHOD OF PREPARING A SUBSTRATE WITH FORMING AND REMOVING THE CHECK PATTERNS IN SCRIBING REGIONS BEFORE DICING TO FORM SEMICONDUCTOR DEVICE

CROSS-REFERENCE TO RELATED APPLICATIONS

This patent application is based upon and claims the benefit of priority of Japanese Patent Application No. 2009-156803 filed on Jul. 1, 2009 the entire contents of which are incorporated herein by reference.

BACKGROUND OF THE INVENTION

1. Field of the Invention

The present invention generally relates to a manufacturing method of a semiconductor device having electrode pads in plural semiconductor chip forming regions provided in a semiconductor substrate.

2. Description of the Related Art

One type of semiconductor device is a so-called chip size package (CSP) having a size substantially the same as the semiconductor chips and illustrated in FIG. 1.

FIG. 1 is a cross-sectional view of the above example of the semiconductor device.

Referring to FIG. 1, one type of semiconductor device 200 typically includes a semiconductor chip 201, a check pattern 202, an internal connection terminal 203, an insulating layer 204, a wiring pattern 205, a solder resist layer 207 and an external connection terminal 208.

The semiconductor chip 201 includes a semiconductor substrate 211, a semiconductor element 212, an electrode pad 213 and a protection film 216.

The semiconductor substrate 211 is a thin substrate and has an element forming face 211A on which the semiconductor element 212 is formed. The semiconductor substrate has a stepped portion 221 which surrounds the semiconductor element 212 and is substantially arranged on a side of the element forming face 211A.

The semiconductor element 212 is formed on the element forming face 211A. The electrode pad 213 is arranged on the semiconductor element 212. The electrode pad 213 is electrically connected to the semiconductor element 212. The electrode pad 213 has a connecting face 213A.

The protection film 216 is formed on the semiconductor element 212 and the element forming face 211A. The connecting face 213A and the checking terminal connecting face 224A are exposed to an outside through the protection film 216.

The check pattern 202 is provided for testing electrical characteristics. The check pattern 202 includes a check pattern body 223 (Test Element Group, hereinafter referred to as TEG), and a check pattern electrode 224 having a checking terminal connecting face 224A. The check pattern body 223 is formed on an outer peripheral portion of the element forming face 211A. The check pattern electrode 224 is formed on the check pattern body 223. The checking terminal connecting face 224A is a face to which a terminal (not illustrated) of inspection equipment (e.g. prove station) is connected.

The internal connection terminal 203 is formed on the connecting face 213A of the electrode pad 213. The internal connection terminal 203 has a flat connecting face 203A.

The insulating resin layer 204 is provided to cover the semiconductor chip 201, a side surface of the internal connection terminal 203, the check pattern 202 and the stepped portion 221.

By forming the stepped portion 221 and the insulating resin layer 204 covering the side surfaces of the stepped portion 221 and the semiconductor chip 201, it is possible to prevent the insulating resin layer 204 from peeling off from semiconductor substrate 211 when plural of the semiconductor devices 200 are separated into individual semiconductor devices 200 in the process illustrated in FIG. 8.

The connecting face 203A of the internal connection terminal 203 is exposed through the insulating resin layer 204. The insulating resin layer 204 has a wiring forming face 204A which is substantially planar relative to the connecting face 203A of the internal connection terminal 203.

The wiring pattern 205 is formed on the wiring forming face 204A. The wiring pattern 205 is connected to the connecting face 203A of the internal connection terminal 203. In this way, the wiring pattern 205 is electrically connected to the semiconductor chip 201 via the internal connection terminal 203. The wiring pattern 205 has a terminal connecting face 205A on which the external connection terminal 208 is formed.

The solder resist layer 207 is formed on the wiring forming face 204A. The solder resist layer 207 has an opening 207A through which the terminal connecting face 205A is exposed.

The external connection terminal 208 is formed on the terminal connecting face 205A. The external connection terminals 208 are electrically connected to pads of an implementing board (not illustrated) such as a motherboard when the semiconductor device 200 is installed in implementing the board.

FIG. 2 through FIG. 8 illustrate manufacturing processes of the semiconductor device illustrated in FIG. 1. Referring to FIG. 2 through FIG. 7, regions J are semiconductor chip forming regions (hereinafter referred to as semiconductor chip forming region J), regions K are scribing regions (hereinafter referred to as scribing region K), and regions L are cutting regions where the semiconductor substrate 231 is cut (hereinafter referred to as cutting region K).

Referring to FIG. 2 through FIG. 8, a method of manufacturing the first semiconductor device 200 illustrated in FIG. 1 is described.

Referring to FIG. 2, the semiconductor substrate 231 having plural regions for forming semiconductor chips J, plural scribing regions K surrounding the plural regions for forming the semiconductor chips J, and cutting regions L having widths narrower than the scribing regions K is prepared. The semiconductor substrate 231 is made of a mother material of the semiconductor substrate 211 illustrated in FIG. 2. At this stage, the semiconductor substrate 231 is not thinned. The scribing regions K include plural belt-like regions orthogonally crossing each other.

Then, the semiconductor chips 201 are formed on the surface 231A of the semiconductor substrate 231 in correspondence with the plural regions for forming the semiconductor chips J. The check patterns 202 are formed on the surfaces 231A of the semiconductor substrate 231 in correspondence with the scribing regions K.

Thereafter, a terminal (not illustrated) of the inspection equipment such as a prove station is made to come in contact with the checking terminal connecting face 224A for testing electrical characteristics of the check pattern 202.

Referring to FIG. 3, grooves 233 are formed by dicing in the scribing region K including plural orthogonally crossing regions for partly removing the check patterns 202. The check patterns 202 which are not removed by the dicing are left on both sides of the grooves 233.

The dicing is carried out every one line. Therefore, the grooves are formed after the dicing is carried out plural times. The width M of the groove 233 is less than the width of the scribing region K and greater than the width of the cutting region L. When the width of the scribing region K is 100 μm and the width of the cutting region L is 40 μm, the width M of the groove 233 may be 60 μm.

Referring to FIG. 4, the internal connection terminal 203 is formed on the connecting face 213A of the electrode pad 213. At this stage, the internal connection terminal 203 is shaped like a cone.

Next, referring to FIG. 5, a sheet-like insulating resin (i.e. the base material of the insulating resin layer 204) which is partially hardened is pressed toward the upper surface of the structure illustrated in FIG. 4 and the sheet-like insulating resin is completely hardened. Thus, the flat connecting face 203A is formed on the internal connection terminal 203, the grooves 233 are filled with the sheet-like insulating resin, and the insulating resin layer 204 is formed to cover the plural semiconductor chips 201.

Referring to FIG. 6, the wiring pattern 205 is formed on the wiring forming face 204A of the insulating layer 204. Thereafter, the solder resist layer 207 having an opening portion 207A and the external connection terminal 208 are sequentially formed.

Referring to FIG. 7, the semiconductor substrate 231 is thinned from a side of the surface 231B positioned opposite to the surface 231A of the semiconductor substrate 231. With this, the structures corresponding to the semiconductor devices 200 are formed in the plural regions for forming the semiconductor chips J. At this stage, the plural semiconductor devices 200 are not separated.

Referring to FIG. 8, the plural semiconductor devices 200 are obtained by cutting the structure illustrated in FIG. 7 at portions corresponding to the cutting regions L. As described, plural semiconductor devices 200 are manufactured.

However, the check patterns 202 are removed with low accuracy in the manufacturing method illustrated in FIG. 1. Said differently, the accuracy of a dicing blade relative to a cutting position of an object to be processed is generally insufficient. Therefore, it is necessary to substantially reduce the width M of the groove 233 in comparison with the width of the scribing region K.

When the check pattern 202 is removed after substantially reducing the width M of the groove 233 relative to the width of the scribing region K, the check pattern 202 which could not be removed is left on the both sides of the groove 233 (see FIG. 3).

Because the check pattern 202 is brittle, peeling or chipping of the check pattern 202 may occur which thereby drops the yield in manufacturing the semiconductor devices 200.

Because a contact of the semiconductor substrate 231 and the insulating layer 204 is weak in the manufacturing method of the semiconductor devices 200 illustrated in FIG. 1, the insulating resin layer 204 may be peeled off from the semiconductor substrate 231 or 211 when the semiconductor substrate 231 is cut in reference to FIG. 8. Therefore, the yield drops in the manufacturing method of the semiconductor devices 200.

Further, because the grooves 233 are processed by the plural times of the dicing, the manufacturing time of the semiconductor device 200 increases and, said differently, the productivity of fabricating the semiconductor devices 200 drops.

[Patent Document 1] Japanese Laid-open Patent Publication No. 2001-168231

SUMMARY OF THE INVENTION

Accordingly, embodiments of the present invention may provide a novel and useful manufacturing method of a semiconductor device solving one or more of the problems discussed above.

More specifically, the embodiments of the present invention may provide a manufacturing method of a semiconductor device including preparing a semiconductor substrate including plural regions for forming semiconductor chips, plural scribing regions surrounding the plural regions for forming the semiconductor chips, and plural cutting regions which are formed in the plural scribing regions and have widths less than those of the scribing regions, forming check patterns and semiconductor chips, the check patterns being arranged on a first surface of the semiconductor substrate at portions corresponding to the plural scribing regions having checking terminal connecting faces, and provided for testing electrical characteristics of the semiconductor substrate, the semiconductor chips including semiconductor elements arranged on the first surface of the semiconductor substrate at portions corresponding to the plural regions for forming the semiconductor chips, electrode pads having connecting faces which are electrically connected to the semiconductor elements, and a protection film covering the semiconductor elements while enabling exposing the connecting faces and the checking terminal connecting faces to an outside, forming a resist film over the checking terminal connecting faces of checking terminals, the connecting faces of the electrode pads and the protection film, forming through grooves having widths less than those of the scribing regions and greater than those of the check patterns and the cutting regions; removing the check pattern with a wet blast process using the resist film and collectively forming grooves at portions of the protection film facing the through grooves and at portions of the semiconductor substrate facing the through grooves; removing the resist film, forming internal connection terminals on the contacting faces of the electrode pads, forming an insulating resin layer including a sheet-like insulating resin as a base material by pressing the sheet-like insulating resin to the protection film and the grooves to form a flat connecting face over the internal connection terminals and fill a space under the flat connecting face with the sheet-like insulating resin, forming a wiring forming face on the insulating resin layer by removing the insulating resin layer until connecting faces of the internal connection terminals are exposed to the outside, forming wiring patterns connected to the connecting faces of the internal connection terminals on the wiring forming face, and cutting the semiconductor substrate and the insulating resin layer to separate the plural semiconductor elements into individual semiconductor devices.

According to this aspect, the resist layer is formed on the checking terminal connecting faces, the connecting faces of the electrode pads, and the protection films after the check pattern and semiconductor chip forming step, and the through grooves being narrower than the scribing regions and wider than the check patterns and the cutting regions are formed in the resist film. Therefore, the through grooves may have widths substantially the same as and slightly smaller than the widths of the scribing regions.

Further, by applying a wet blast process through the resist layer having through grooves having substantially the same widths as those of the scribing regions, the check patterns are certainly removed. According to this aspect, the yield of the semiconductor devices can be improved.

Further, the surface of the semiconductor substrate at the portions where the insulating resin layers are formed is exposed to the outside and therefore roughened with the wet blast process of forming the through grooves in the protection films at the portions facing the through grooves and in the semiconductor substrate at the portions facing the through grooves. According to this aspect, the contact between the semiconductor substrate and the insulating resin layer is improved to thereby improve the yield of the semiconductor devices.

Further, the through grooves in the protection films and the semiconductor film at the portions facing the through grooves are formed at the same time. According to this aspect, the groove can be formed in a short time in comparison with a case where dicing is carried out plural times to thereby improve productivity in fabrication of the semiconductor devices.

Further, the resist film may be a photosensitive resist film, and in forming the through grooves, the photosensitive resist film may be exposed to light through a mask and then developed.

According to this aspect, the through grooves may be formed in the photosensitive resist film with high positional accuracy to enable forming the through grooves having the widths substantially the same as and slightly less than those of the scribing regions.

Additional objects and advantages of the embodiments are set forth in part in the description which follows, and in part will become obvious from the description, or may be learned by practice of the invention. The objects and advantages of the embodiments will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Hereinafter, numerical and alphabetical symbols typically designate as follows:
10: Semiconductor device;
11: Semiconductor chip;
13: Internal connection terminal;
13A: Connecting face;
14: Insulating resin layer;
15: Wiring pattern;
17: Solder resist layer;
18: External connection terminal;
21: Semiconductor substrate;
21A: Element forming face;
22: Semiconductor element;
22A, 25A, 41A: Upper surface;
22B: Side surface;
23: Electrode pad;
23A: Connecting face;
25: Protection film;
27: Stepped portion;
31: Externally connecting pad;
31A: Terminal connecting face;
33: Opening portion;
35: Semiconductor substrate;
35A, 35B, 53A: Surface;
37: Check pattern;
38: Check pattern body;
39: Check pattern electrode;
39A: Checking terminal connecting face;
43: Through groove;
45: Wet blast device;
46: Jet nozzle;
47: Liquid;
48: Particle;
51: Groove;
53: Plate;
A: Semiconductor chip forming region;
B: Scribing region;
C: Cutting region; and
D, E, F: Width Hereinafter, a description is given below, with reference to FIG. 9 through FIG. 21 of embodiments of the present invention.

Figure 1:
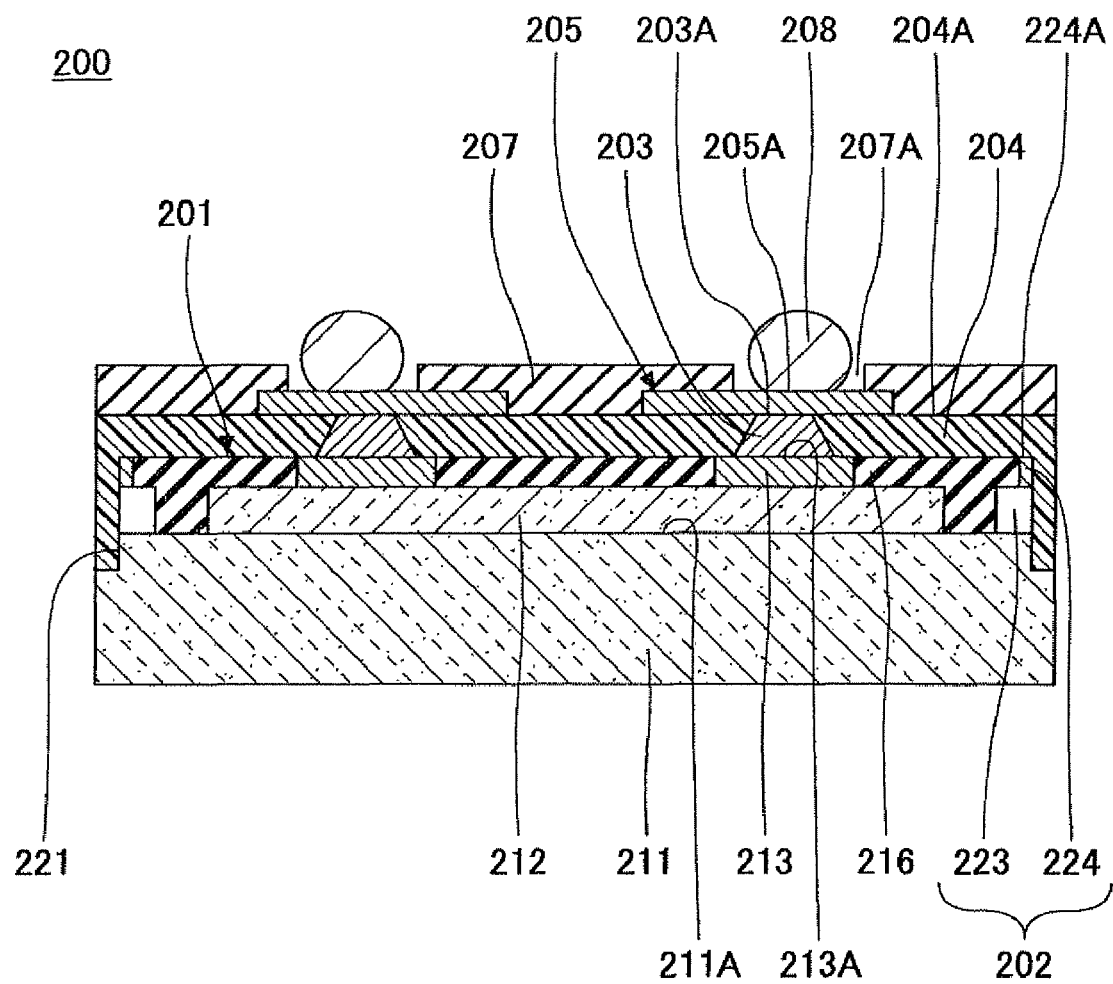
FIG. 1 is a cross-sectional view of a semiconductor device.
Figure 2:
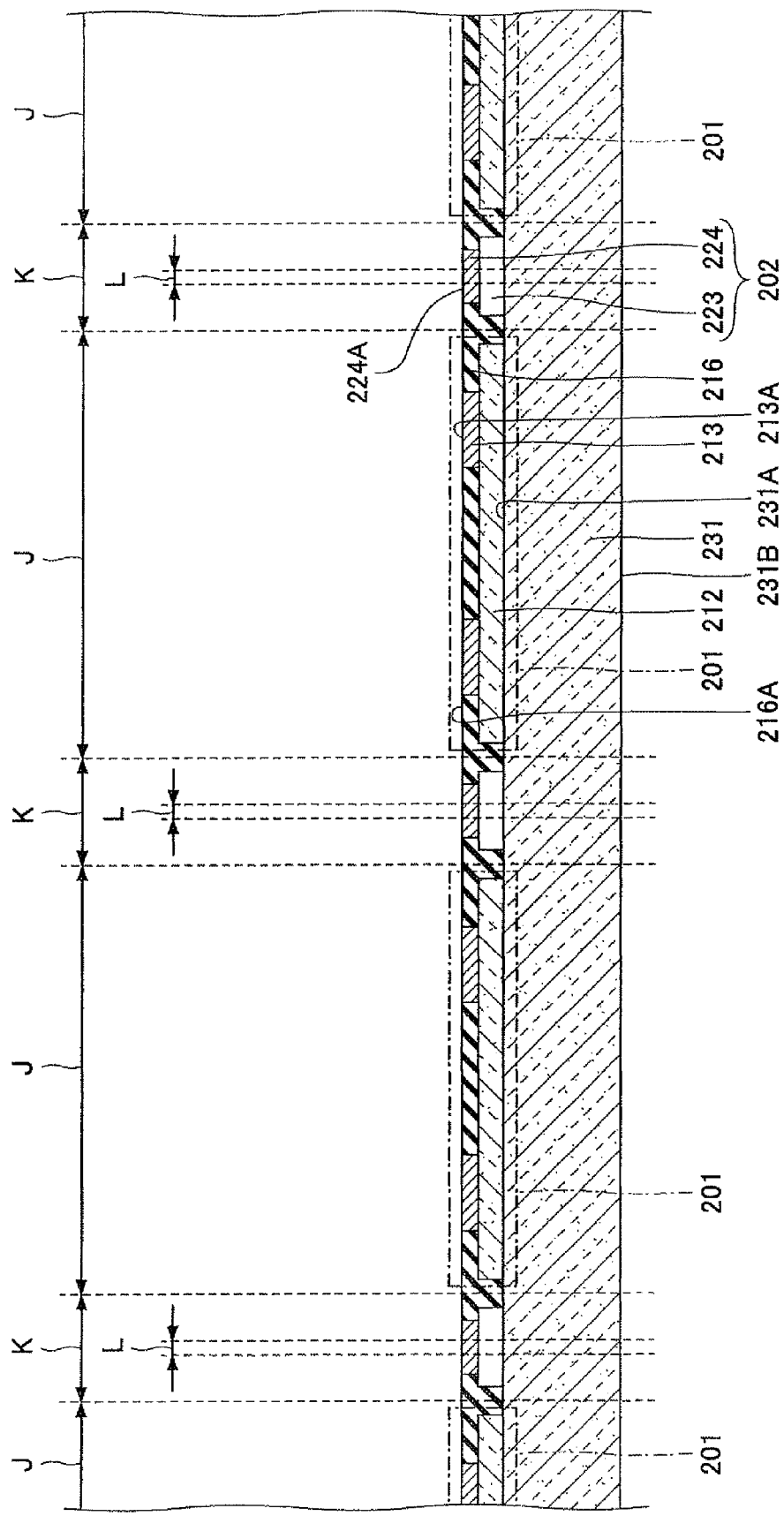
FIG. 2 illustrates the first process of a manufacturing method of the semiconductor device illustrated in FIG. 1.
Figure 3:
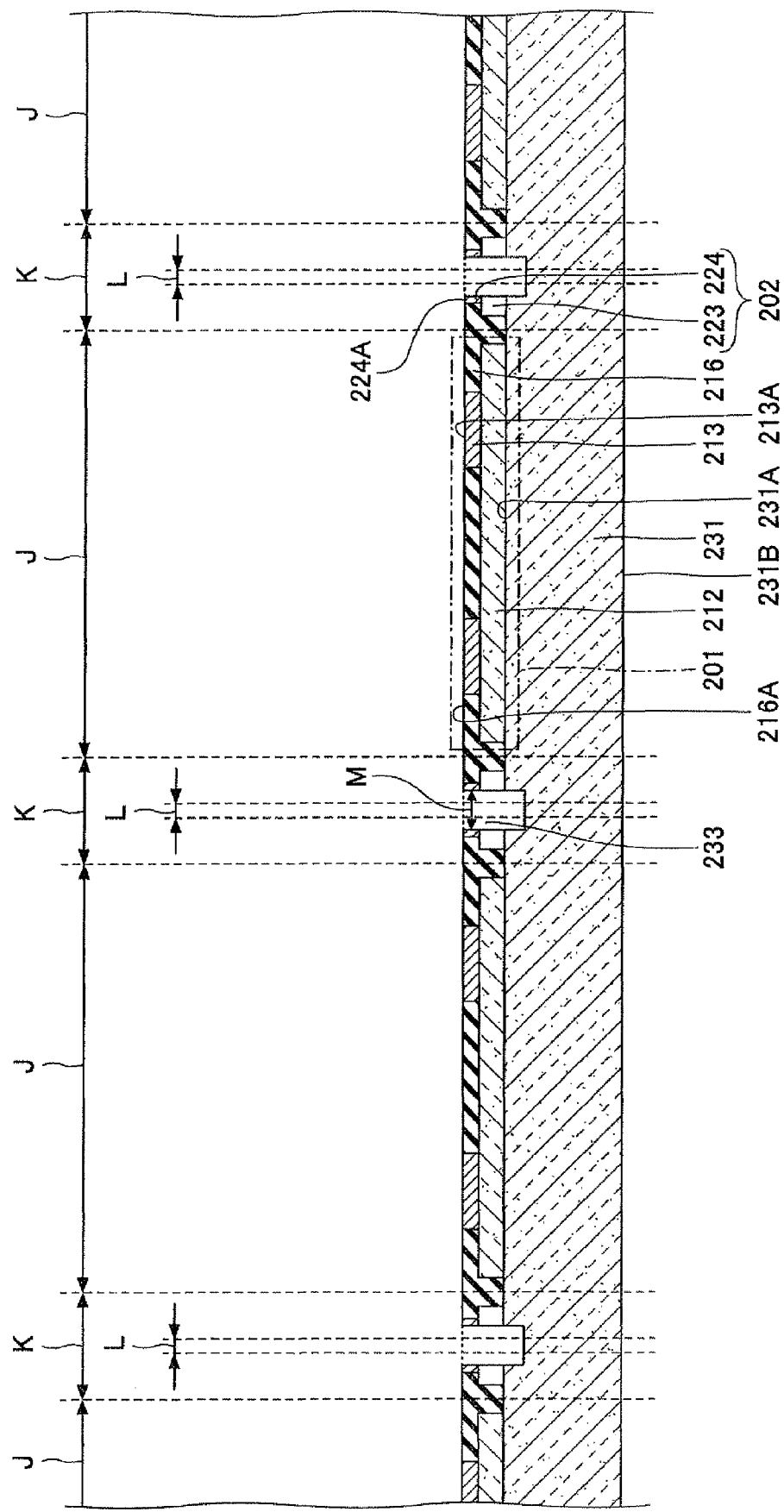
FIG. 3 illustrates the second process of the manufacturing method of the semiconductor device illustrated in FIG. 1.
Figure 4:
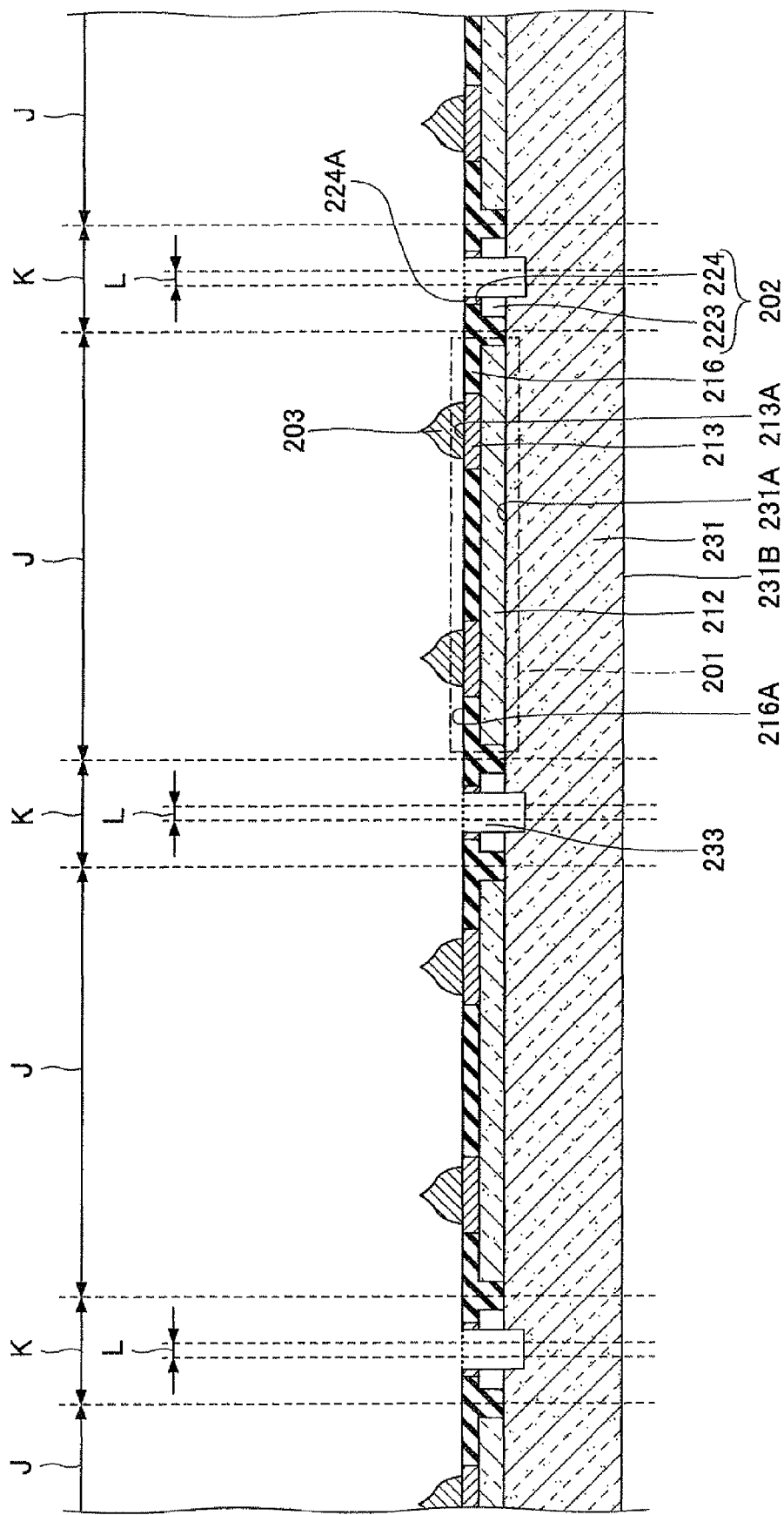
FIG. 4 illustrates the third process of the manufacturing method of the semiconductor device illustrated in FIG. 1.
Figure 5:
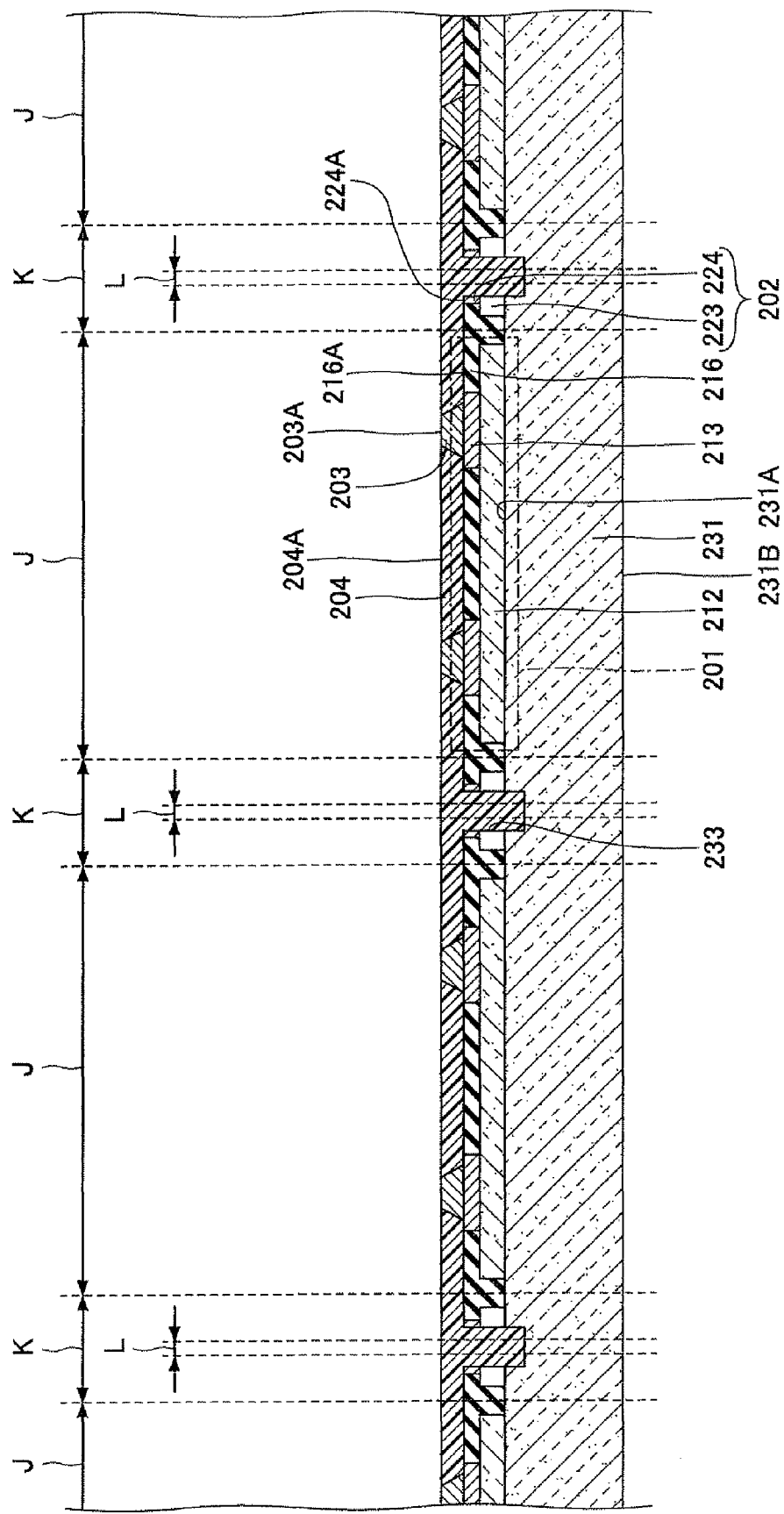
FIG. 5 illustrates the fourth process of the manufacturing method of the semiconductor device illustrated in FIG. 1.
Figure 6:
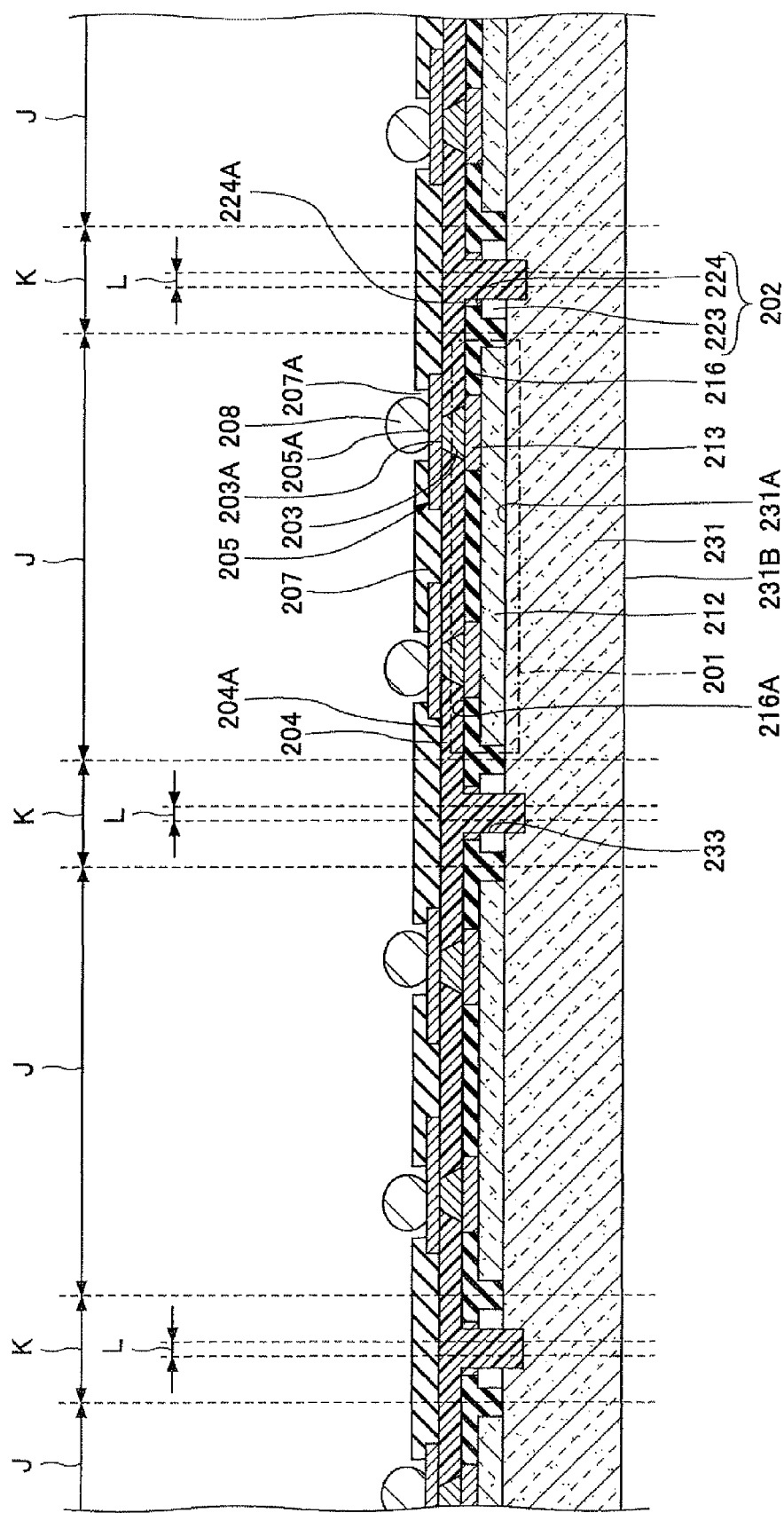
FIG. 6 illustrates the fifth process of the manufacturing method of the semiconductor device illustrated in FIG. 1.
Figure 7:
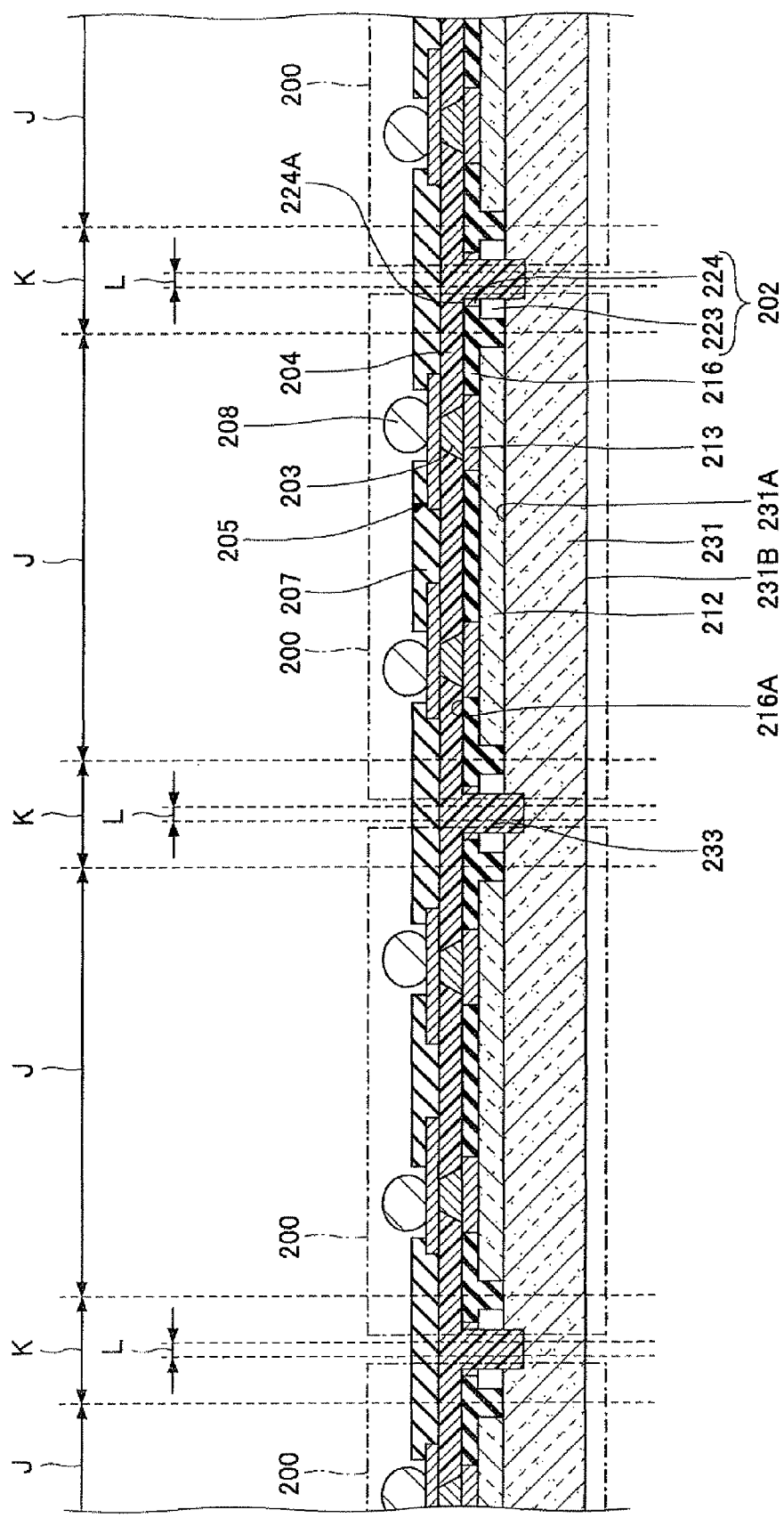
FIG. 7 illustrates the sixth process of the manufacturing method of the semiconductor device illustrated in FIG. 1.
Figure 8:
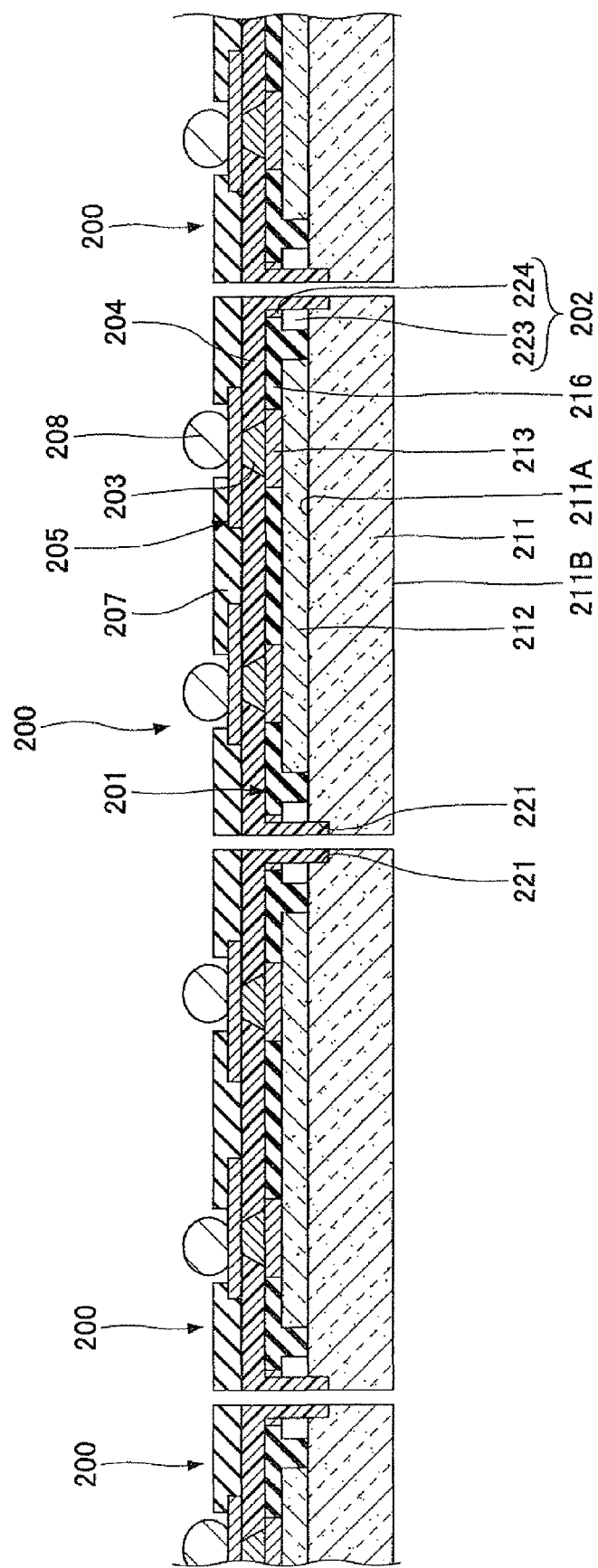
FIG. 8 illustrates the seventh process of the manufacturing method of the semiconductor device illustrated in FIG. 1.
Figure 9:
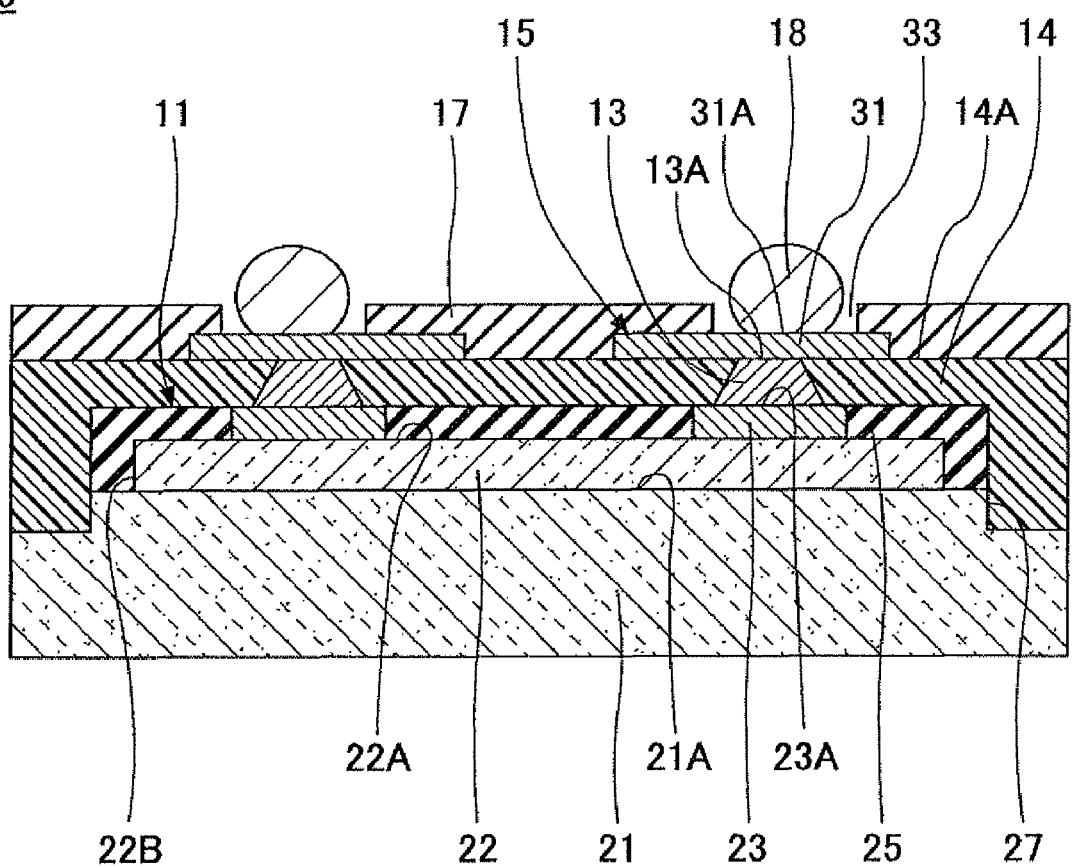
FIG. 9 is a cross-sectional view of the semiconductor device of an embodiment according to the present invention.

FIG. 9 is a cross-sectional view of the semiconductor device of an embodiment according to the present invention.

Referring to FIG. 9, the semiconductor device 10 of the embodiment includes a semiconductor chip 11, an internal connection terminal 13, an insulating resin layer 14, a wiring pattern 15, a solder resist layer 17 and an external connection terminal 18.

The semiconductor chip 11 includes a semiconductor substrate 21, a semiconductor element 22, an electrode pad 23 and a protection film 25.

The semiconductor substrate 21 is a thin substrate and has an element forming face 21A on which the semiconductor element 22 is formed. The semiconductor substrate 21 arranged on a side of the element forming face 21A has a stepped portion 27 which surrounds the semiconductor element 22. The surface of the semiconductor substrate 21 of a portion forming the stepped portion 27 is a roughened surface. The stepped portion 27 is covered by the insulating resin layer 14.

By roughening the face of the stepped portion 27 of the semiconductor substrate 21, contact between the face of the semiconductor substrate 21 at a portion forming the stepped portion and the insulating resin layer 14 is improved. Therefore, yield of semiconductor devices is improved.

The depth of the stepped portion 27 relative to the element forming face 21A is, for example, 10 through 30 μm. It may be possible to use a silicon wafer as the semiconductor substrate 21. When the silicon substrate is used as the semiconductor substrate 21, the thickness of the semiconductor substrate 21 may be 100 through 200 μm.

The semiconductor element 22 is formed on the element forming face 21A of the semiconductor substrate 21. The semiconductor element 22 includes a diffusion layer (not illustrated), plural insulating layers, and wiring patterns (e.g. via and wiring) formed in the plural insulating layers.

The electrode pad 23 is formed on the upper surface 22A of the semiconductor element 22. The electrode pad 23 has a connecting face 23A on which the internal connection terminal 13 is arranged. The electrode pad 23 is electrically connected to the semiconductor element 22. The material of the electrode pad 23 is, for example, aluminum (Al). The thickness of the electrode pad 23 is, for example 1 μm.

The protection film 25 is provided on the upper surface 22A and the side surface 22B of the semiconductor element 22. The connecting face 23A of the electrode pad 23 is exposed through the protection film 25 to the outside. The protection film 25 is, for example, a $Si_3N_4$ film. When the $Si_3N_4$ film 25 is used as the protection film 25, the thickness of the protection film is, for example, 0.3 through 0.7 mm.

The internal connection terminal 13 is formed on the connecting face 23A of the electrode pad 23. With this, the internal connection terminal 13 is electrically connected to the semiconductor chip 11. The internal connection terminal 13 has a flat connecting face 13A. The internal connection terminal 13 is, for example, a bump or an Au bump.

The insulating resin layer 14 is arranged to cover a side surface of the internal connection terminal 13, a connecting face 23A of the electrode pad 23 on which the internal connection terminal 13 is not formed, the protection film 25 and the stepped portion 27. The connecting face 13A of the internal connection terminal 13 is exposed through the insulating resin layer 14. The insulating resin layer 14 includes a flat wiring forming face 14A. The wiring forming face 14A is structured to rest on the same plane as the connecting face 13A of the internal connection terminal 13. The insulating resin layer 14 is, for example, a completely hardened resin. The material of the insulating layer 63 is, for example, an epoxy resin.

The wiring pattern 15 is arranged on the connecting face 13A of the internal connection terminal 13 and the wiring forming face 14A. In this way, the wiring pattern 15 is electrically connected to the semiconductor chip 11 via the internal connection terminal 13. The wiring pattern 15 includes an externally connecting pad 31 having a terminal connecting face 31A. The material of the wiring pattern 15 is, for example, a Ti/Cu laminated film which is formed by laminating Ti layers having a thickness of 0.1 μm and Cu layers having a thickness of 0.5 μm.

The solder resist layer 17 is formed on the wiring forming face 14A. The solder resist layer 17 covers the wiring patterns 15 at portions other than the externally connecting pads 31. The solder resist layer 17 has opening portions 33 through which the terminal connecting faces 31A of the externally connecting faces 31A are exposed.

The external connection terminals 18 are arranged on the terminal connecting faces 31A of the externally connecting pads 31. The external connection terminals 18 are electrically connected to pads (not illustrated) of an implementing board (not illustrated) such as a motherboard when the semiconductor device 10 is installed in the implementing board. The internal connecting terminals 18 are, for example, solder balls.

FIG. 10 through FIG. 21 illustrate manufacturing steps of the semiconductor device of the embodiment according to the present invention. Referring to FIG. 10 through FIG. 20, regions A are semiconductor chip forming regions (hereinafter referred to as semiconductor chip forming region A), regions B are scribing regions (hereinafter referred to as scribing region B), and regions C are cutting regions at which the semiconductor substrates are cut (hereinafter referred to as cutting region C). In FIG. 10 through FIG. 21, the same reference symbols are applied to the same structural elements of the semiconductor device 10 of the embodiment.

Referring to FIG. 10 through FIG. 21, a method of manufacturing the first semiconductor device 10 of the embodiment is described.

Figure 10:
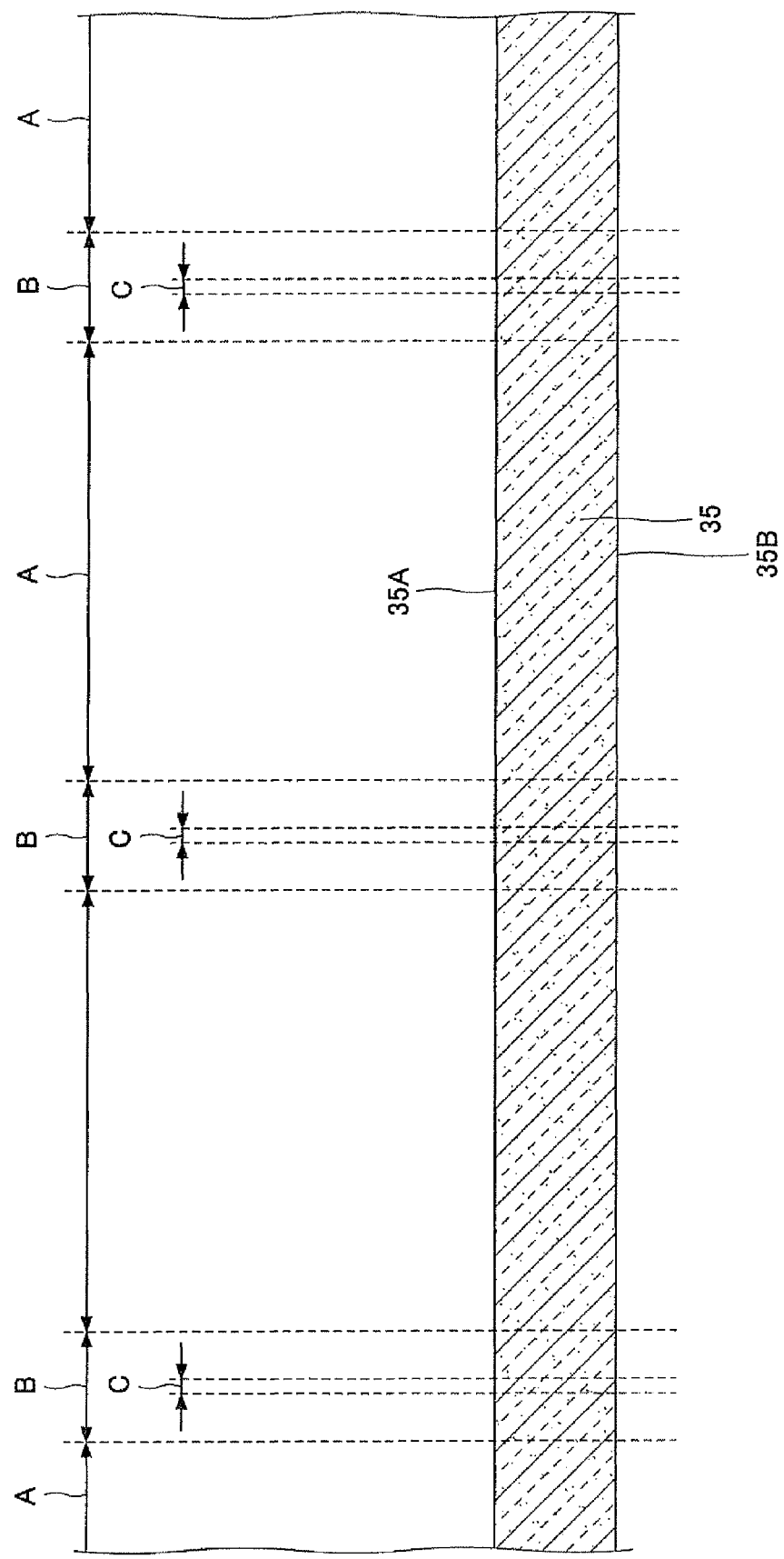
FIG. 10 illustrates the first manufacturing process in the manufacturing method of semiconductor devices of the embodiment according to the present invention.

Referring to FIG. 10, the semiconductor substrate 35 having the plural regions A for forming the semiconductor chips, the plural scribing regions B surrounding the plural regions A for forming the semiconductor chips, and the cutting regions C having widths less than those of the scribing regions B are prepared as a semiconductor substrate preparing step.

The semiconductor substrate 35 is a base material of the plural semiconductor substrates 21 (see FIG. 9). At this stage, the semiconductor substrate 35 is not thinned yet. The scribing regions B include plural belt-like regions orthogonally crossing one another. For example, it is possible to use a silicon wafer as the semiconductor substrate 35. The thickness of the semiconductor substrate 35 may be 725 μm.

The widths of the scribing regions B may be 100 μm. In this case, the widths of the cutting regions C may be 50 μm.

Figure 11:
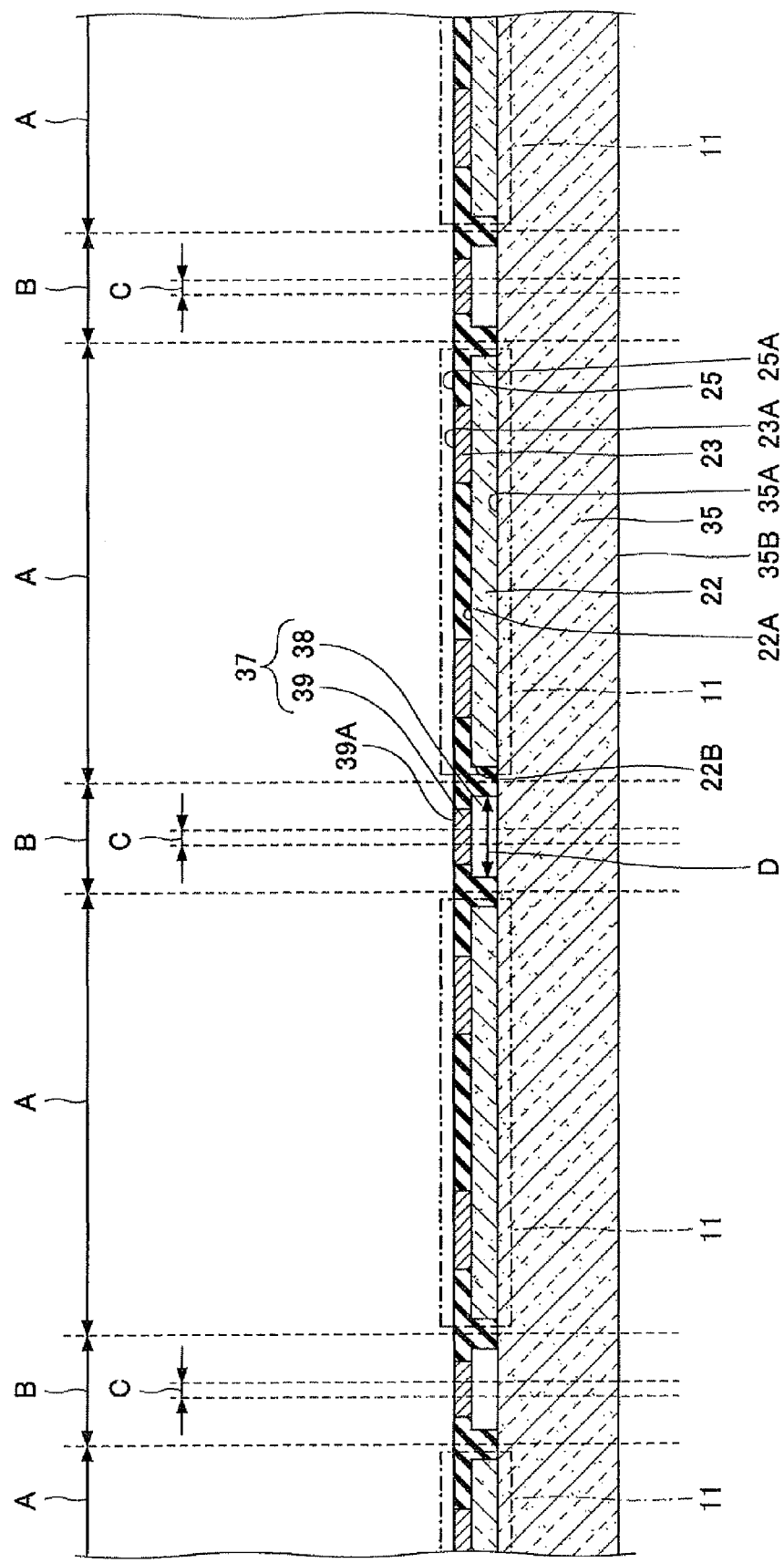
FIG. 11 illustrates the second manufacturing process in the manufacturing method of semiconductor devices of the embodiment according to the present invention.

Referring to FIG. 11, the semiconductor chips 11 are formed to include check patterns 37 which are formed on a surface 35A (first surface) of the semiconductor substrate 35 at portions corresponding to the scribing regions B and have checking terminal connecting faces 39A, the semiconductor elements 22 which are arranged on the surface 35A of the semiconductor substrate 35 at portions corresponding to the plural regions A for forming the semiconductor chips, electrode pads 23 which are connected to the corresponding semiconductor elements 22 and have connecting faces 23A, protection films 25 which cover the upper surfaces 22A and side surfaces 22B of the semiconductor elements 22 and through which connecting faces 23A and checking terminal faces 39A are exposed, as a check pattern and semiconductor chip forming step. Known methods may be used in the check pattern and semiconductor chip forming step.

The check patterns 37 are described in detail. The check pattern 37 is a pattern for electrical checking, and includes a check pattern body 38 and a check pattern electrode 39. The check pattern body 38 is formed on the surface 35A of the semiconductor substrate 35 at a portion corresponding to the scribing region B. The check pattern body 38 is a TEG and includes a diffusion layer, an insulating layer, a conductor or the like (not illustrated). The width D of the check pattern body 38 is greater than the width of the check pattern electrode 39. When the width of the scribing region B is 100 µm, the width D of the check pattern body 38 is, for example, 70 µm. The check pattern body 38 and the semiconductor element 22 are simultaneously formed.

The check pattern electrode 39 is formed on the check pattern body 38. The check pattern electrode is electrically connected to the check pattern body 38. The check pattern electrode 39 includes a checking terminal connecting face 39A. The checking terminal connecting face 39A is a face with which a checking terminal is in contact when the electrical characteristics of the check pattern body 38 are checked between a step illustrated in FIG. 11 and a step illustrated in FIG. 12. The checking terminal may be a probe in a case where the inspection equipment is a prove station.

The material of the check pattern electrode 39 is, for example, µl. When the material of the check pattern electrode 39 is Al, the thickness of the check pattern electrode 39 is, for example, 1 µm. The check pattern electrode 39 and the electrode pad 23 may be simultaneously formed. The protection film 25 is formed such that an upper surface 25A of the protection film 25 is arranged to be planar relative to the connecting faces 23A of the electrode pads 23 and the checking terminal connecting faces 39A. The protection film 25 is, for example, a $Si_3N_4$ film. When the $Si_3N_4$ film is used as the protection film 25, the protection film may be formed by, for example, a Chemical Vapor Deposition (CVD) method. When the $Si_3N_4$ film 25 is used as the protection film 25, the thickness of the protection film 25 arranged on the upper surfaces 22A of the semiconductor elements is, for example, 0.3 through 0.7 mm.

Figure 12:
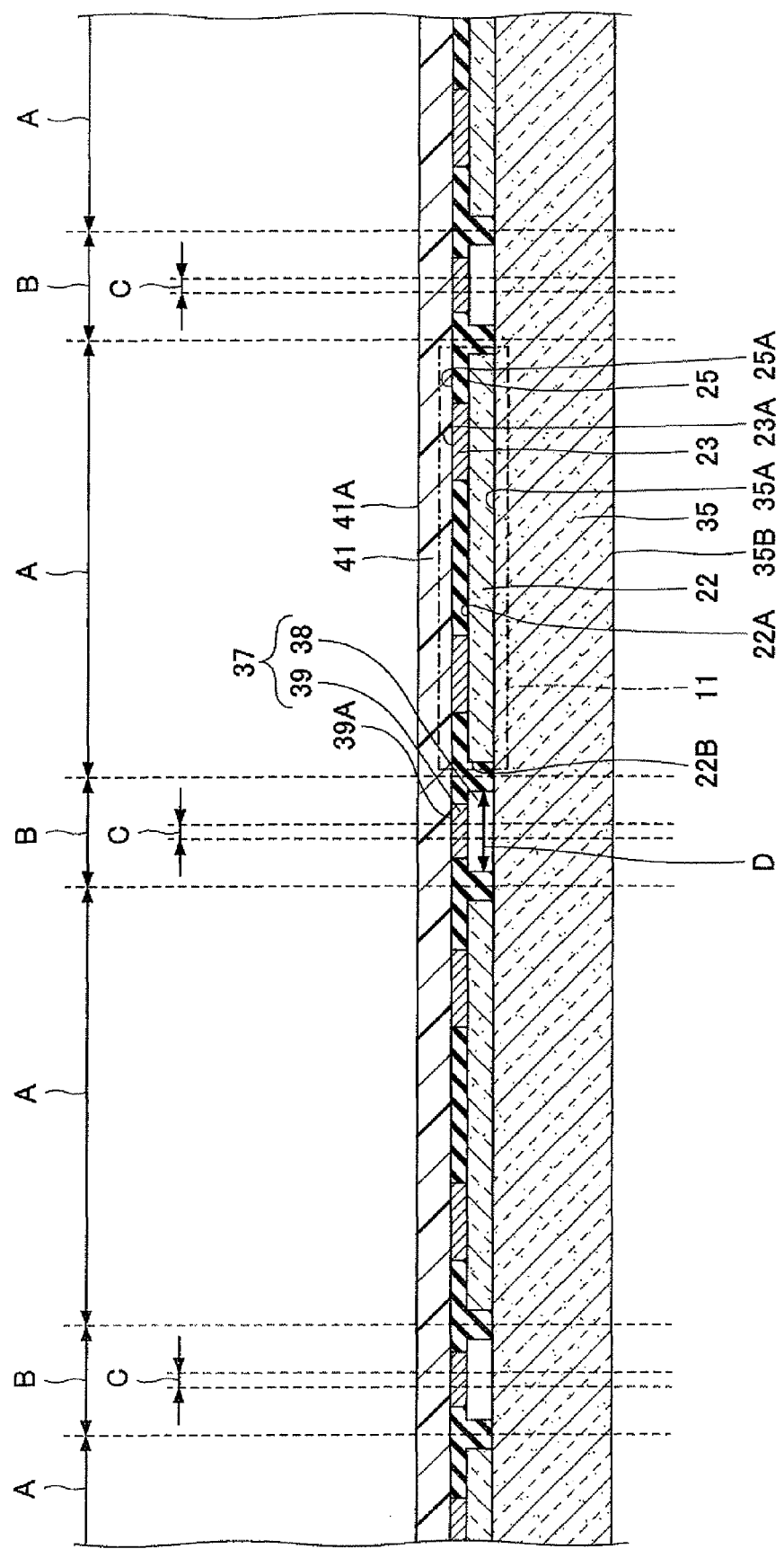
FIG. 12 illustrates the third manufacturing process in the manufacturing method of semiconductor devices of the embodiment according to the present invention.

Next, in the process illustrated in FIG. 12, a photosensitive resist film 41 is formed as a resist film on the checking terminal connecting face 39A, the connecting faces 23A of the electrode pads 23, and the protection film 25 as the resist film forming step.

The photosensitive resist film 41 is, for example, a dry film resist. When the dry film resist is used as the photosensitive resist film 41, the thickness of the photosensitive resist film 41 becomes, for example, 25 through 35 µm.

Figure 13:
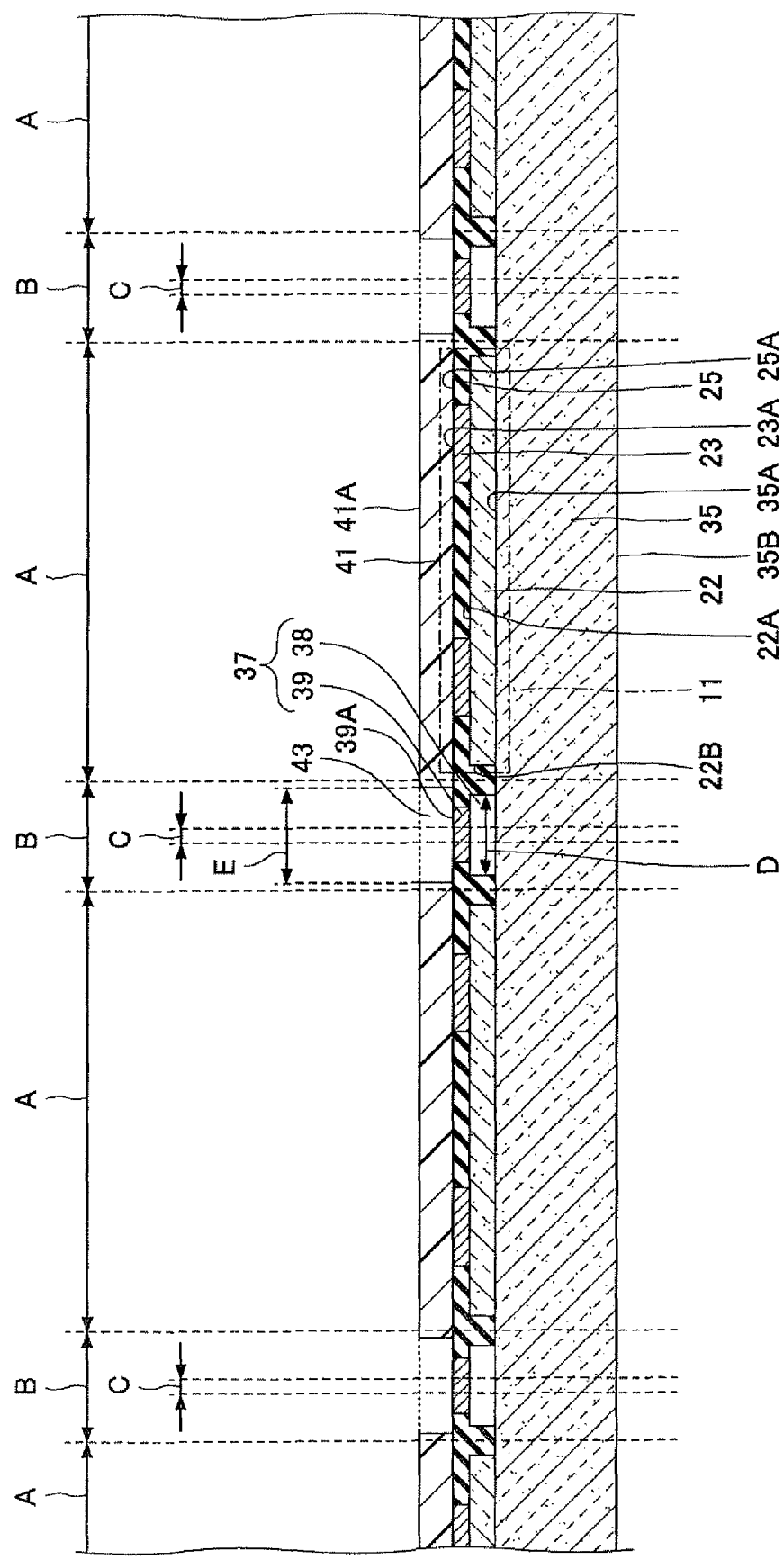
FIG. 13 illustrates the fourth manufacturing process in the manufacturing method of semiconductor devices of the embodiment according to the present invention.

In a step illustrated in FIG. 13, the photosensitive resist film 41 is exposed to light over a mask (not illustrated). Thereafter, the photosensitive resist film 41 is developed. Thus, a through groove 43 having a width less than that of the scribing region B and greater than that of the cutting region C is formed on the photosensitive resist film 41 as a through groove forming step.

Specifically, when the photosensitive resist film 41 is formed using a dry film resist of a positive type in the resist film forming step illustrated in FIG. 12, the through grooves 43 are formed by preparing a mask (not illustrated) having opening portions from which the upper surfaces 41A of the photosensitive resist films 41 are exposed to the outside at portions corresponding to the regions where the through grooves 43 are formed, irradiating the portion corresponding to the region where the through grooves 43 are formed in the photosensitive resist film 41 with light, developing the photosensitive resist film 41, and removing the photosensitive resist film 41 at the portions irradiated by the light.

The photosensitive resist film 41 having the through grooves 43 is the mask for removing the check patterns 37 in a step illustrated in FIG. 14 described later.

As described, after the check pattern and semiconductor forming step, the photosensitive resist film 41 is formed on the checking terminal connecting faces 39A, the connecting faces 23A of the electrode pads 23, and the protection films 25, is exposed to light through the mask, and is developed. Thus, the through grooves 43 are formed in the photosensitive resist film 41 with high accuracy. It becomes possible to form the through grooves 43 in the photosensitive resist film 41 with high accuracy. Because chipping is not apt to occur with a wet blast method, it is possible to form the through grooves 43 having widths substantially the same as and slightly less than the widths of the scribing regions B.

For example, it is possible to make the widths D of the through grooves 43 less than the width of the scribing region B by 10 µm. Specifically, when the widths of the scribing regions B are 100 µm and the widths D of the check pattern bodies 38 are 70 µm, the widths E of the through grooves E may be 90 µm.

Figure 20:
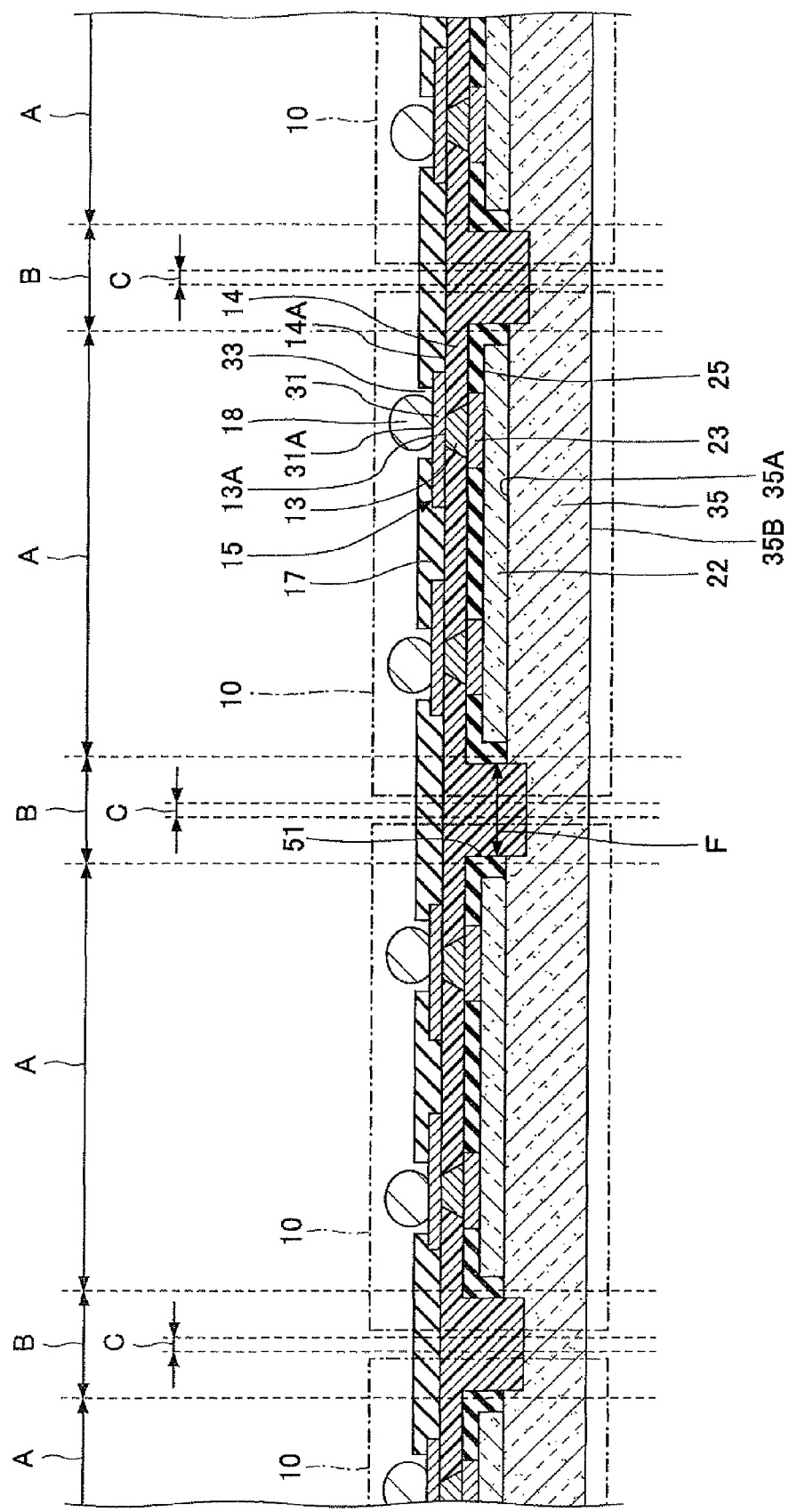
FIG. 20 illustrates the eleventh manufacturing process in the manufacturing method of semiconductor devices of the embodiment according to the present invention.
Figure 21:
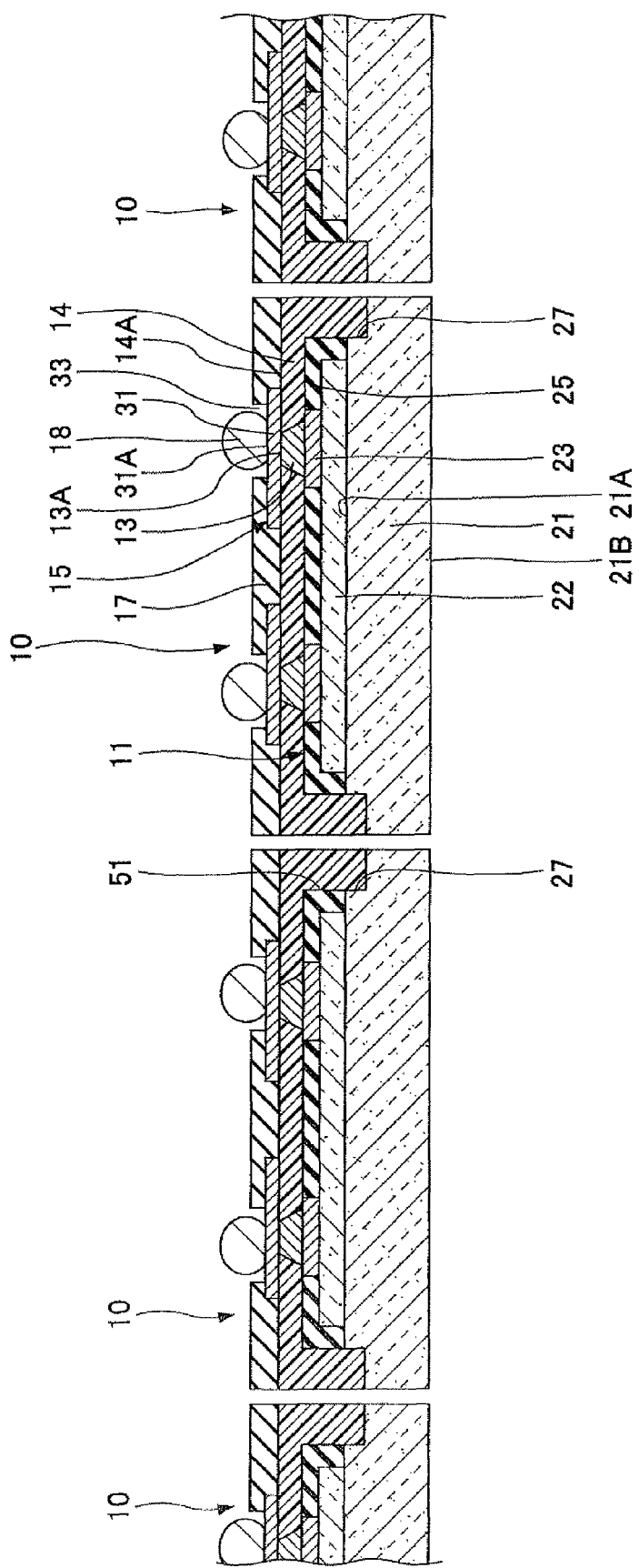
FIG. 21 illustrates the twelfth manufacturing process in the manufacturing method of semiconductor devices of the embodiment according to the present invention.

Each one of the through grooves 43 is formed to be one continuous groove extending alongside the arranged plural semiconductor elements to be separated in reference to FIG. 21. With this formation, the thickness of the semiconductor substrate 35 becomes uniform at the portions in the vicinity of the cutting regions C. Therefore, it is possible to easily cut the semiconductor substrate 35 illustrated in FIG. 20 in the step illustrated in FIG. 21.

Figure 14:
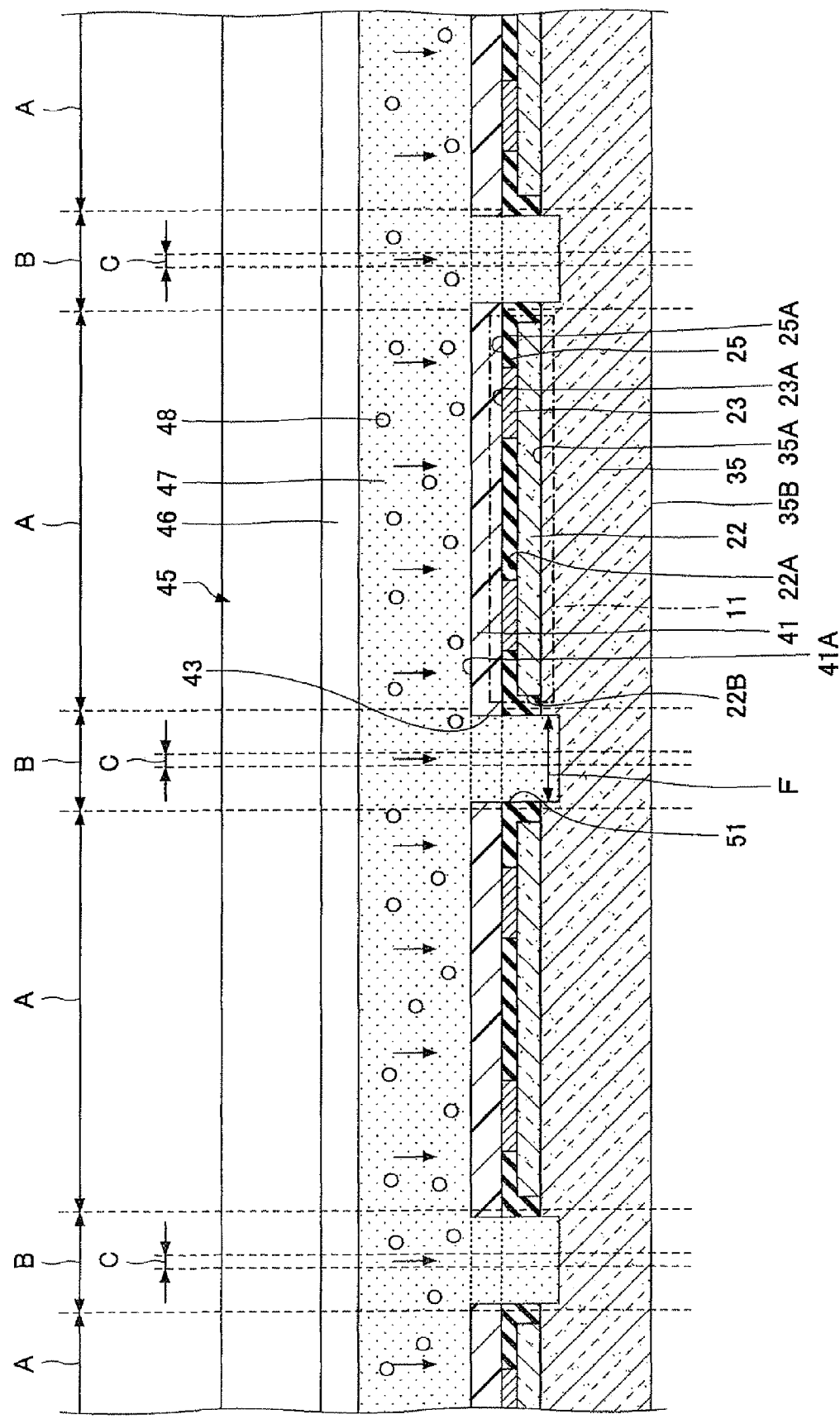
FIG. 14 illustrates the fifth manufacturing process in the manufacturing method of semiconductor devices of the embodiment according to the present invention.

Next, in the step illustrated in FIG. 14, a wet blast device 45 is arranged above the structure illustrated in FIG. 13. A stirred liquid mixture is sprayed over the photosensitive resist film 41 having the through grooves 43 and the entire upper surface of the structure illustrated in FIG. 13 by the wet blast device 45. Thus, the check patterns 37 positioned in the bottoms of the through grooves 43 are removed, and the protection films 25 facing the grooves 51 and the grooves 51 are simultaneously formed in the semiconductor substrate 35 as a check pattern removing and groove forming step.

Next, the wet blast device 45 and the wet blast process are described. The wet blast device 45 uniformly stirs a liquid mixture of liquid 47 and particles 48, and sprays the stirred liquid mixture at a high speed on a subject to be processed (the structure illustrated in FIG. 13) with a force of compressed air from a jet nozzle 46.

The wet blast process is a process using the wet blast device 45 described above. The particles 48 of the liquid mixture are alumina having a grain diameter of, for example, 10 through 20 µm. The concentration of the alumina contained in the mixture may be 14 percent by volume (vol %). The liquid 47 of the liquid mixture may be water. The jet pressure of the liquid mixture may be 0.25 MPa.

As described, by spraying the stirred liquid mixture in the wet blast process over the entire photosensitive resist film 41 including the through grooves 43 having the widths substantially the same as the widths of the scribing regions B, it is possible to certainly remove all of the check patterns 37 formed in the scribing regions B. With this, the brittle checking patterns 37 are not left in the outer peripheries of the semiconductor chips 11. Therefore, it is possible to improve the yield of the semiconductor devices 10.

Further, the surface of the semiconductor substrate 35 at the portions where the insulating resin layers 14 are formed is roughened with the wet blast process of forming the grooves 51 in the protection film 25 at the portions facing the through grooves 43 and in the semiconductor substrate 21, 35 at the portions facing the through grooves 43. Therefore, the contact between the semiconductor substrate 21, 35 and the insulating resin layer 14 is improved to thereby improve the yield of the semiconductor devices 10.

Further, the grooves 51 are simultaneously formed in the portions of the protection films 25 and the semiconductor substrate 35 both facing the through grooves 43 by jetting the stirred liquid mixture on the entire upper surface of the structure illustrated in FIG. 13 by the wet blast process using the photosensitive resist film 41 having the through grooves 43. Therefore, it is possible to improve the productivity of fabricating the semiconductor devices in comparison with a case where the grooves are formed by dicing.

The depths of the grooves 51 formed in the semiconductor substrate 35 are, for example, 5 through 15 μm. The widths F of the grooves 51 are substantially the same as the widths E of the through grooves 43. Specifically, the widths F of the grooves 51 are, for example, 80 μm. The surface roughness of the semiconductor substrate 35 at the portions undergoing the wet blast process is coarser than that undergoing the process with the blade for dicing. Therefore, the contact between the insulating resin layer 14 and the semiconductor substrate 35 may be improved.

Figure 15:
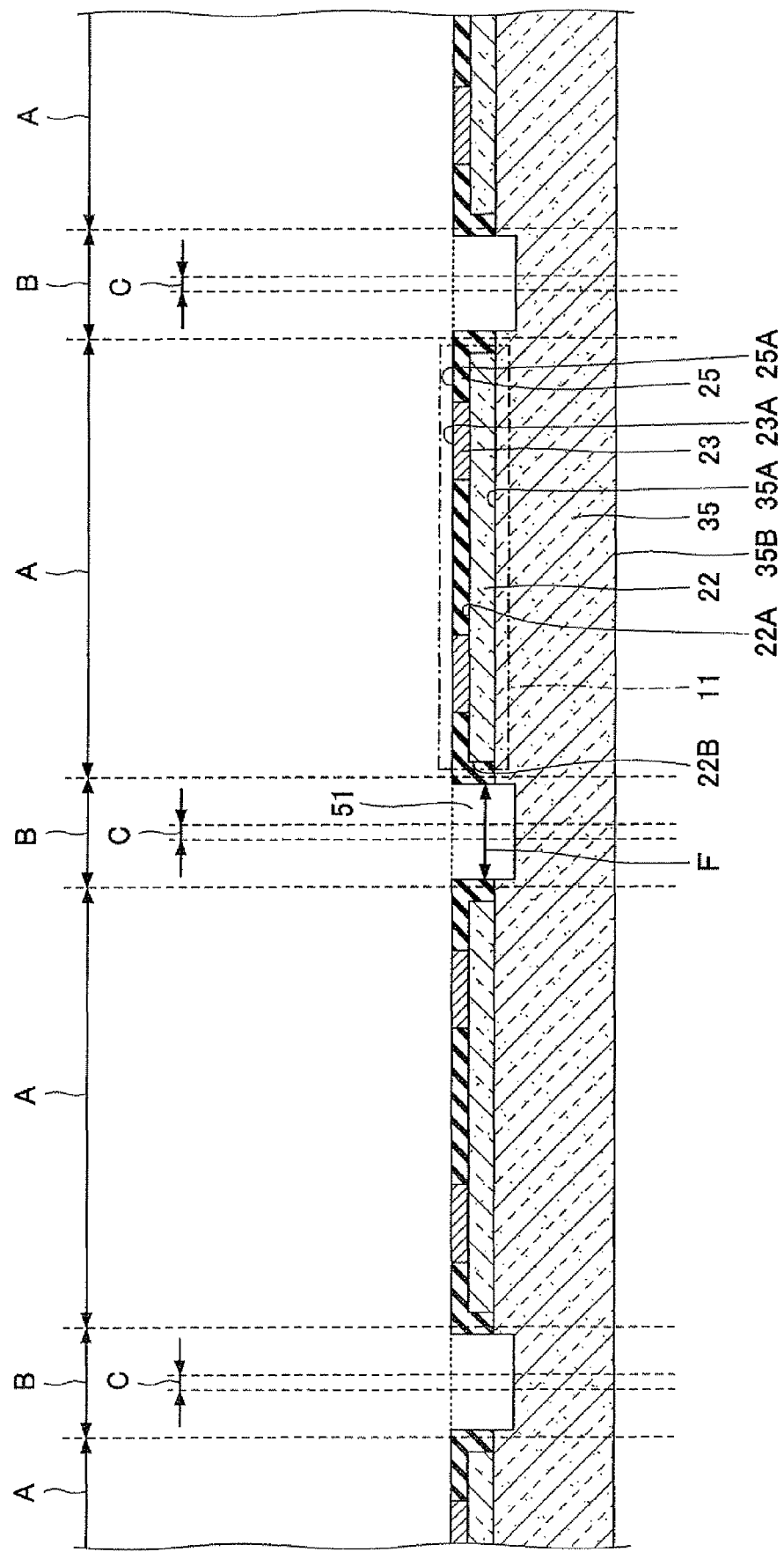
FIG. 15 illustrates the sixth manufacturing process in the manufacturing method of semiconductor devices of the embodiment according to the present invention.

Next, in the step illustrated in FIG. 15, the semiconductor substrate 35 including the plural semiconductor chips 11, the photosensitive resist films 41 and the grooves 51 is obtainable. Then, the photosensitive resist film 41 is removed as a resist film removing process.

Figure 16:
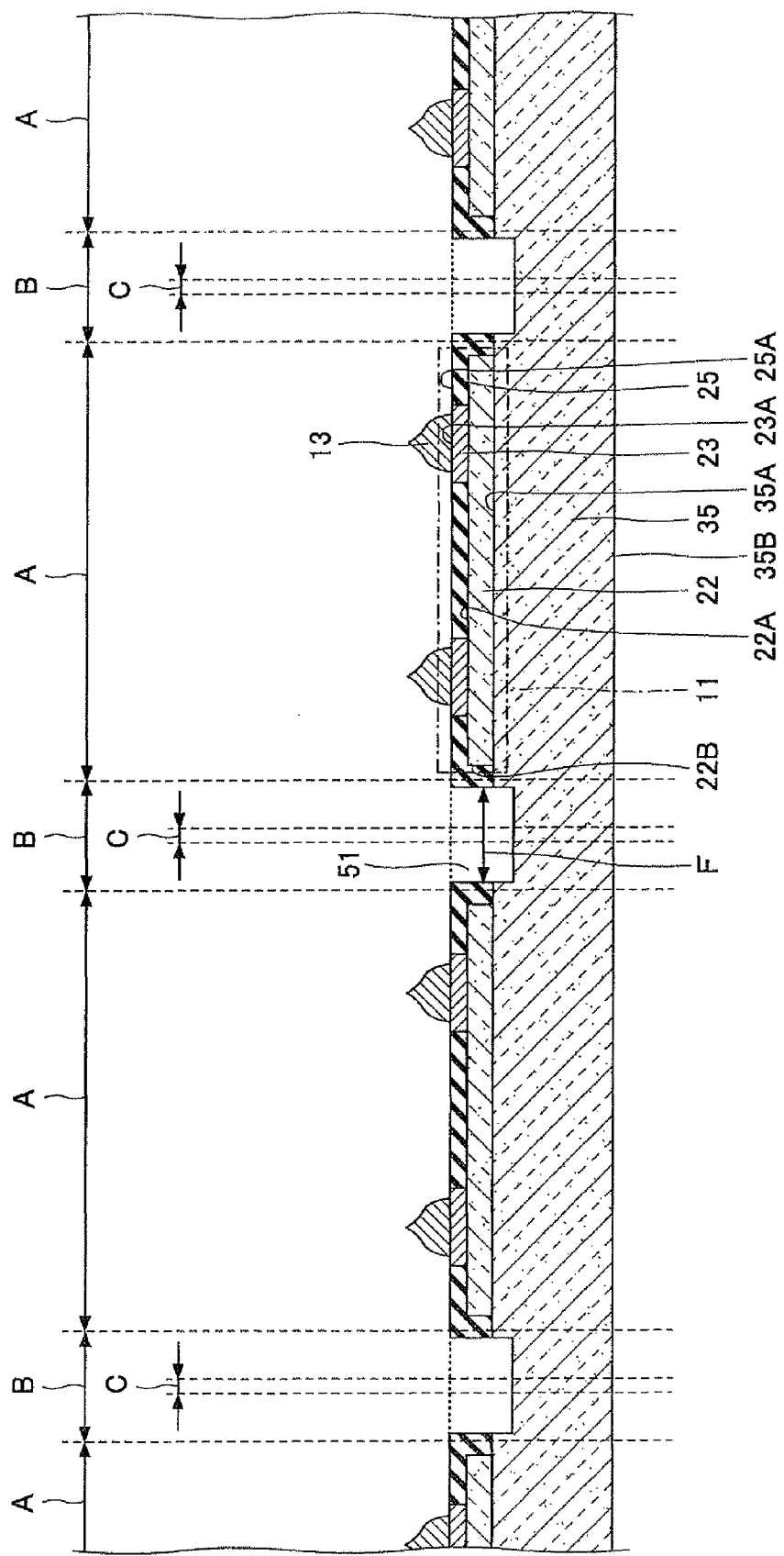
FIG. 16 illustrates the seventh manufacturing process in the manufacturing method of semiconductor devices of the embodiment according to the present invention.

Referring to FIG. 16, the internal connection terminals 13 are formed on the connecting faces 23A of the electrode pads 23 as an internal connection terminal forming step.

At this stage, the internal connection terminal 13 is shaped like a cone. The internal connection terminal 13 is, for example, a bump or an Au bump. When the Au bump is used as the internal connection terminal 13, the internal connection terminal 13 may be formed using a wire bonding device.

Figure 17:
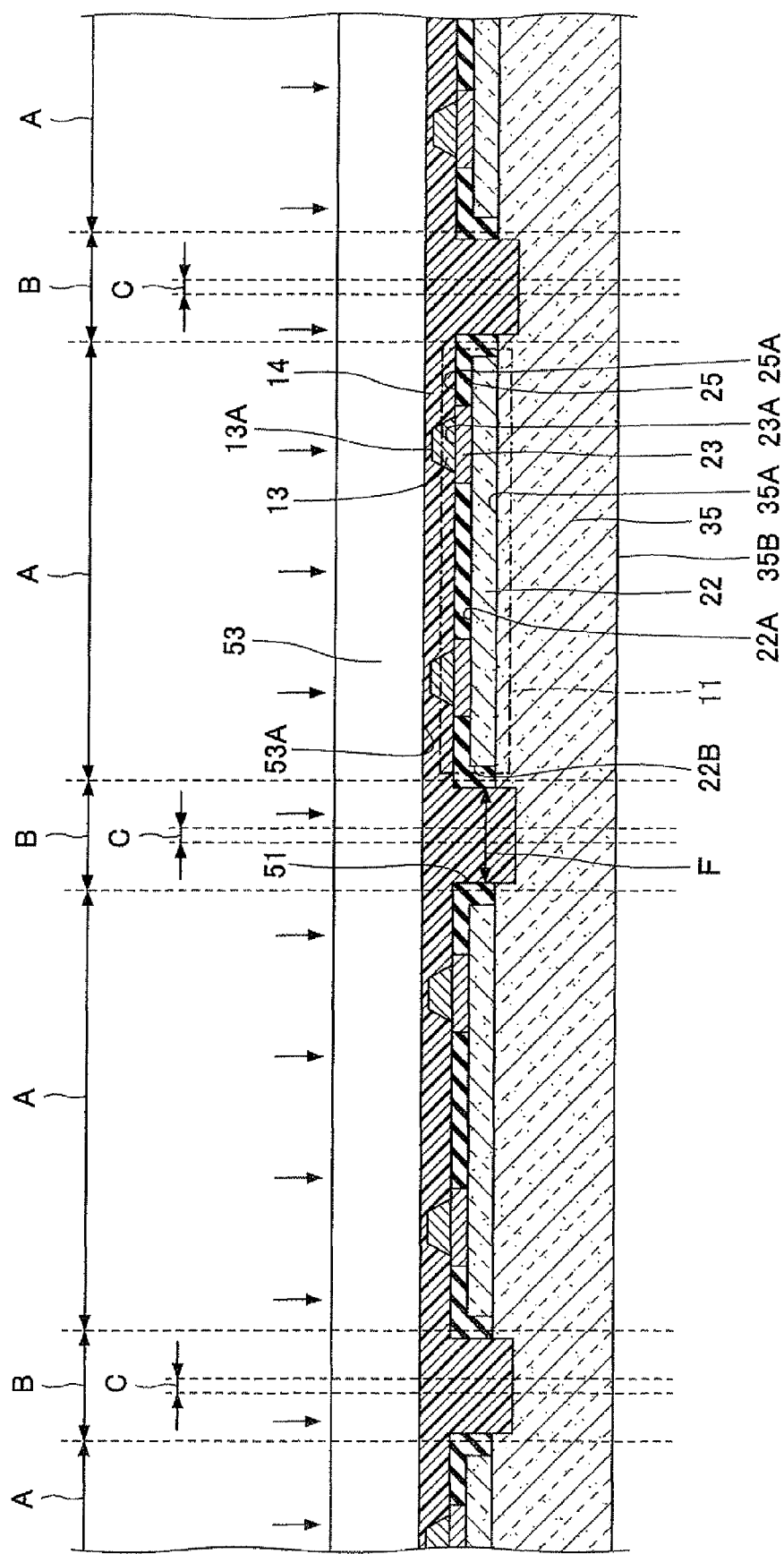
FIG. 17 illustrates the eighth manufacturing process in the manufacturing method of semiconductor devices of the embodiment according to the present invention.

Referring to FIG. 17, a flat connecting face 13A (i.e. a flat surface 53A of a plate 53) is formed over the internal connection terminals 13 by pressing a sheet-like insulating resin (a base material of the insulating resin layer 14), which has the flat surface 53A and is partially hardened, to the plural internal connection terminals 13, the plural protection films 25 and the plural grooves 51. At this time, the grooves 51 are filled with the sheet-like insulating resin which is partially hardened. Thereafter, the sheet-like insulating resin in the partially hardened state is completely hardened as an insulating resin layer forming process.

The insulating resin layer 14 is left on the connecting face 13A of the internal connection terminal 13. The material of the sheet-like insulating resin may be a thermosetting epoxy resin. In this case, by heating the sheet-like insulating resin which is partially hardened, the sheet-like insulating resin can be completely hardened.

Figure 18:
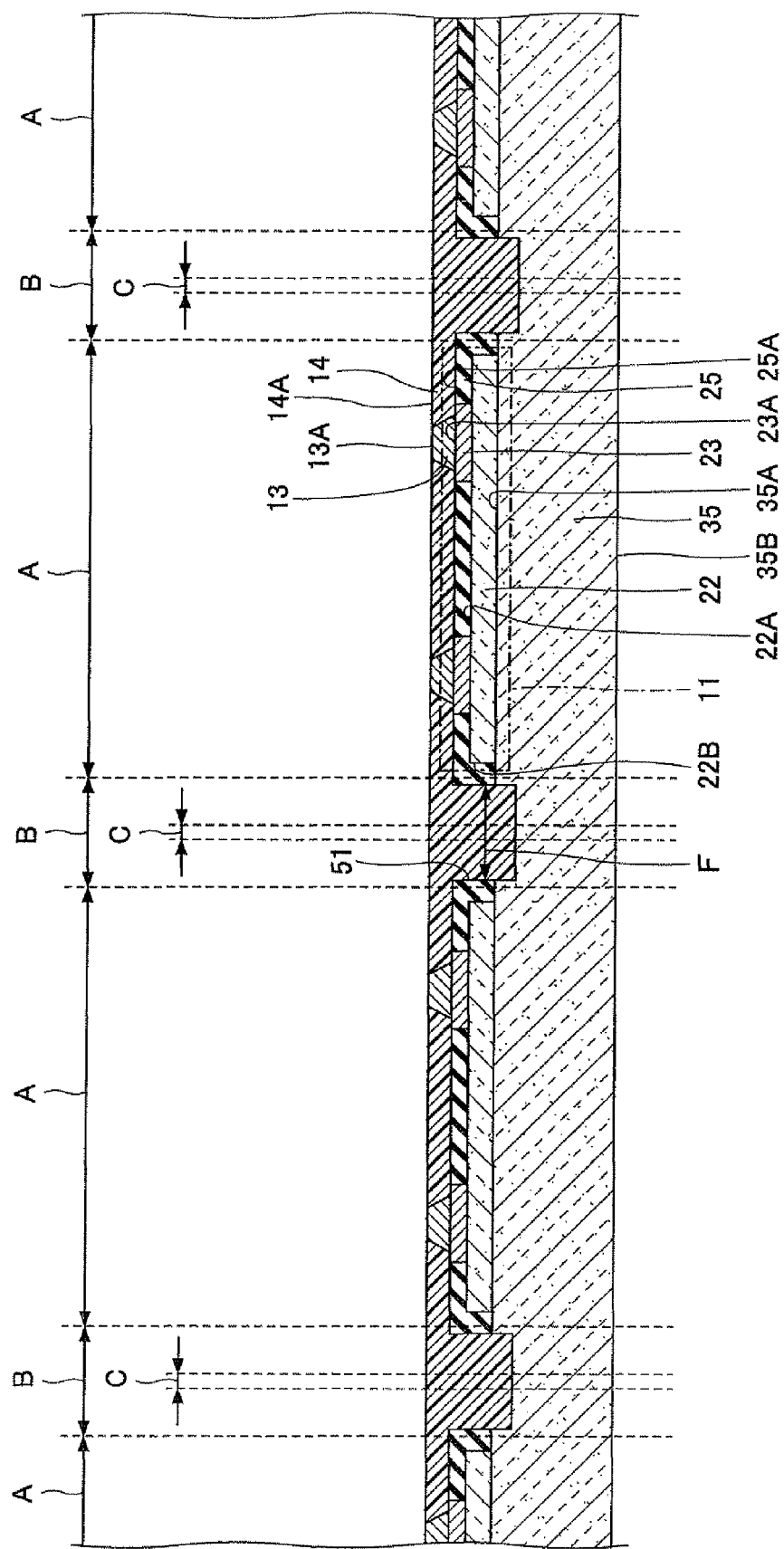
FIG. 18 illustrates the ninth manufacturing process in the manufacturing method of semiconductor devices of the embodiment according to the present invention.

Referring to FIG. 18, the insulating resin layer 14 is removed until the flat connecting faces 13A of the internal connection terminals 13 are exposed to the outside. At this time, a filler is also removed when the filler is included in the insulating resin layer 14. Thus, a flat wiring forming surface 14A is formed in the insulating resin layer 14 as a wiring forming face forming step. Thereafter, the wiring forming face 14A is cleansed.

Specifically, the insulating resin layer 14 may undergo ashing to thereby remove the insulating resin layer 14 until the connecting face 13A of the internal connection terminals 13 are exposed to the outside. Then, the wiring forming faces 14A are cleansed by scrubber cleaning.

Figure 19:
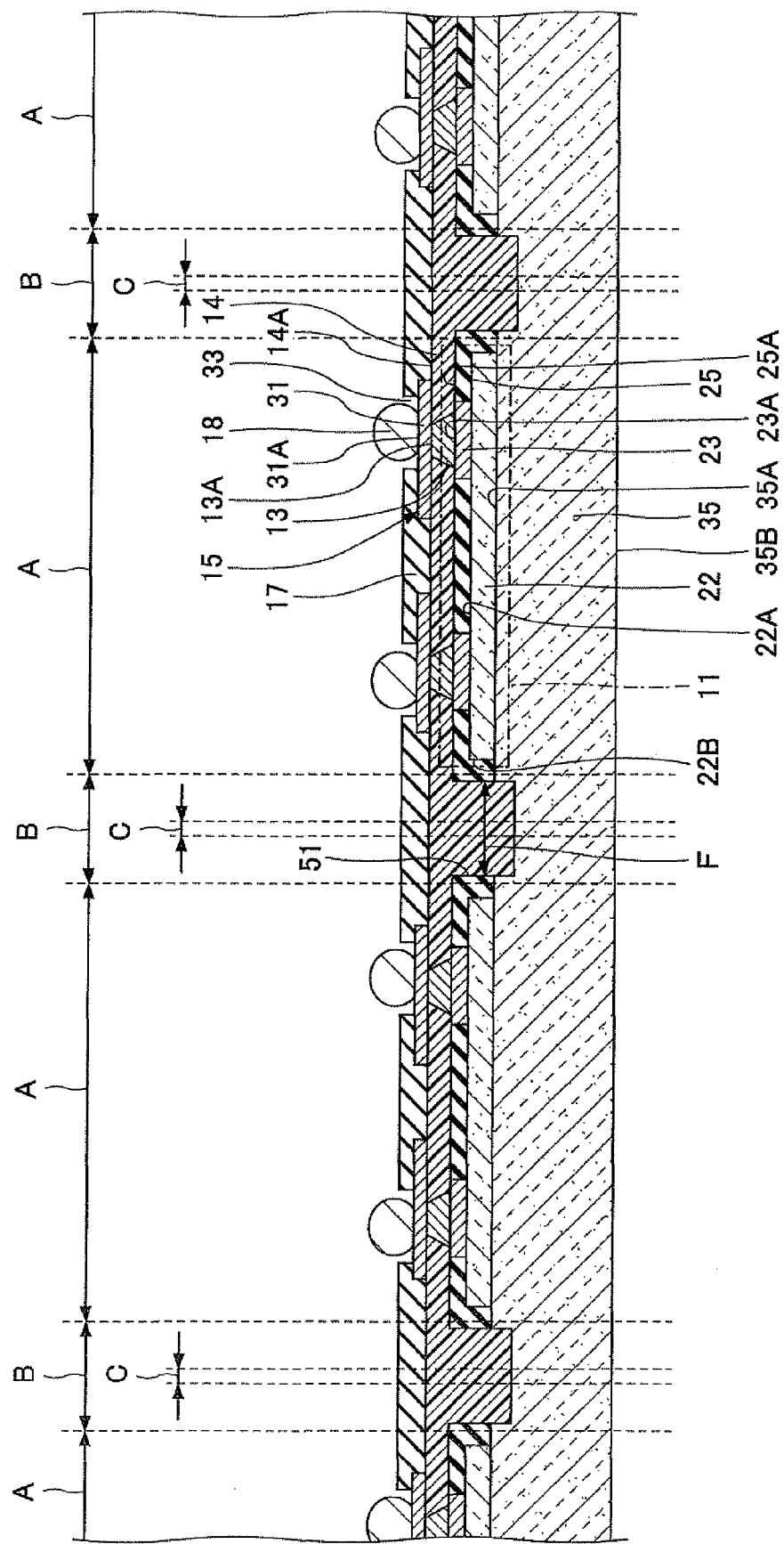
FIG. 19 illustrates the tenth manufacturing process in the manufacturing method of semiconductor devices of the embodiment according to the present invention.

Subsequently, referring to FIG. 19, the wiring patterns 15 connected to the connecting faces 13A of the internal connection terminals 13 are formed as a wiring pattern forming step. Known methods may be used in the wiring pattern forming step.

Specifically, the wiring patterns 15 may be formed by a semi adaptive method. The material of the wiring patterns 15 is, for example, a Ti/Cu laminated film which is formed by sequentially laminating Ti layers having a thickness of 0.1 μm and Cu layers having a thickness of 0.5 μm.

Next, solder resist layers 17 having the opening portions 33, through which the terminal connecting faces 31A are exposed, are formed as a solder resist layer forming step. Known methods may be used in the solder resist layer forming step.

The external connection terminals 18 are formed in the terminal connecting faces 31A as an external connection terminal forming step. Known methods may be used in the external connection terminal forming step. The internal connecting terminals 18 are, for example, solder balls.

Referring to FIG. 20, the semiconductor substrate 35 is thinned from a side of the surface 35B (second surface) positioned opposite to the surface 35A of the semiconductor substrate 35 as a semiconductor substrate thinning step.

With this, the structures corresponding to the semiconductor devices 10 are formed in the plural regions A for forming the semiconductor chips. At this stage, the plural semiconductor devices 10 are not separated.

For example, it may be possible to use a back side grinder to thin the semiconductor substrate 35. The thickness of the thinned semiconductor substrate 35 may be 100 μm through 500 μm.

Referring to FIG. 21, a dicing blade narrower than the widths of the grooves 51 is used to remove the insulating resin layer 14, the semiconductor substrate 35 and the solder resist layer 17 at portions corresponding to the cutting regions C illustrated in FIG. 20. Thus, the plural semiconductor elements 11 are separated to individual semiconductor elements and devices as a cutting step. As described, the plural semiconductor devices 10 are individually separated as illustrated in FIG. 21.

As described, by spraying the stirred liquid mixture in the wet blast process over the entire photosensitive resist film 41 including the through grooves 43 having the widths substantially the same as the widths of the scribing regions B, it is possible to certainly remove all of the check patterns 37 formed in the scribing regions B. With this, the brittle checking patterns are not left in the outer peripheries of the semiconductor chips 11. Therefore, it is possible to improve the yield of the semiconductor devices 10.

Further, the surface of the semiconductor substrate 35 at the portions where the insulating resin layers 14 are formed is roughened with the wet blast process of forming the grooves 51 in the protection films 25 at the portions facing the through grooves 43 and in the semiconductor substrate 21, 35 at the portions facing the through grooves 43. Therefore, the contact between the semiconductor substrate 21, 35 and the insulating resin layer 14 is improved to thereby improve the yield of the semiconductor device 10.

Further, the grooves 51 are simultaneously formed in the portions of the protection film 25 and the semiconductor substrate 35 facing the through grooves 43 by jetting the stirred liquid mixture onto the entire upper surface of the structure illustrated in FIG. 13 by the wet blast process interposing the photosensitive resist film 41 having the through grooves 43. Therefore, it is possible to improve the productivity of fabricating the semiconductor devices in comparison with a case where the grooves are formed by dicing.

As described, the yield of the semiconductor devices is improved and simultaneously the productivity of fabricating the semiconductor devices is improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a semiconductor device comprising:

preparing a semiconductor substrate including plural regions for forming semiconductor chips, plural scribing regions surrounding the plural regions for forming the semiconductor chips, and plural cutting regions which are formed in the plural scribing regions and have widths less than those of the scribing regions;

forming check patterns and semiconductor chips, the check patterns being arranged on a first surface of the semiconductor substrate at portions corresponding to the plural scribing regions having checking terminal connecting faces, and provided for testing electrical characteristics of the semiconductor substrate, the semiconductor chips including semiconductor elements arranged on the first surface of the semiconductor substrate at portions corresponding to the plural regions for forming the semiconductor chips, electrode pads having connecting faces which are electrically connected to the semiconductor elements, and a protection film covering the semiconductor elements while enabling exposing the connecting faces and the checking terminal connecting faces to an outside;

forming a resist film over the checking terminal connecting faces of checking terminals, the connecting faces of the electrode pads and the protection film;

forming through grooves having widths less than those of the scribing regions and greater than those of the check patterns and the cutting regions;

removing the check patterns with a wet blast process using the resist film and collectively forming grooves at portions of the protection film facing the through grooves and at portions of the semiconductor substrate facing the through grooves;

removing the resist film;

forming internal connection terminals on the contacting faces of the electrode pads;

forming an insulating resin layer including a sheet-like insulating resin as a base material by pressing the sheet-like insulating resin onto the protection film and the grooves to form a flat connecting face over the internal connection terminals and fill a space under the flat connecting face with the sheet-like insulating resin;

forming a wiring forming face on the insulating resin layer by removing the insulating resin layer until connecting faces of the internal connection terminals are exposed to the outside;

forming wiring patterns connected to the connecting faces of the internal connection terminals on the wiring forming face; and cutting the semiconductor substrate and the insulating resin layer to separate the plural semiconductor elements into individual semiconductor devices.

2. The manufacturing method of the semiconductor device according to claim 1, wherein, in forming the through grooves, the photosensitive resist film is exposed to light through a mask, and thereafter the through grooves are formed by developing the photosensitive resist film.

3. The manufacturing method of the semiconductor device according to claim 1, wherein each one of the grooves is formed to be one continuous groove extending alongside the arranged plural semiconductor elements to be separated.

4. The manufacturing method of the semiconductor device according to claim 1, further comprising:

forming the solder resist layer having opening portions, through which the terminal connecting faces are exposed to the outside, on the wiring forming face, after forming the wiring pattern and before cutting the semiconductor substrate, the insulating resin layer, and the solder resist layer; and forming external connection terminals on terminal connecting faces of externally connecting pads included in the wiring pattern, after forming the solder resist layer, wherein, in cutting the semiconductor substrate, the insulating resin layer, and the solder resist layer, portions corresponding to the cutting regions are removed.

5. The manufacturing method of the semiconductor device according to claim 4, further comprising:

thinning the semiconductor substrate from a second surface positioned opposite to the first surface of the semiconductor substrate, between forming the external connection terminal and cutting the semiconductor substrate, the insulating resin layer, and the solder resist layer.

* * * * *